(12) United States Patent
Zhang et al.

(10) Patent No.: US 11,057,054 B2
(45) Date of Patent: Jul. 6, 2021

(54) CHANNEL CODING METHOD AND APPARATUS IN COMMUNICATION SYSTEM

(71) Applicant: HUAWEI TECHNOLOGIES CO., LTD., Guangdong (CN)

(72) Inventors: Huazi Zhang, Hangzhou (CN); Rong Li, Hangzhou (CN); Yue Zhou, Hangzhou (CN); Hejia Luo, Hangzhou (CN); Gongzheng Zhang, Hangzhou (CN); Yunfei Qiao, Hangzhou (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

(21) Appl. No.: 16/798,403

(22) Filed: Feb. 23, 2020

(65) Prior Publication Data
US 2020/0287566 A1    Sep. 10, 2020

Related U.S. Application Data

(63) Continuation of application No. 16/398,282, filed on Apr. 30, 2019, now Pat. No. 10,574,266, which is a
(Continued)

(30) Foreign Application Priority Data

Mar. 24, 2017 (CN) .......................... 201710184933.4

(51) Int. Cl.
*H03M 13/13* (2006.01)
*H04L 1/00* (2006.01)
*H03M 13/09* (2006.01)

(52) U.S. Cl.
CPC .......... *H03M 13/13* (2013.01); *H04L 1/0013* (2013.01); *H04L 1/0041* (2013.01);
(Continued)

(58) Field of Classification Search
CPC .. H03M 13/09; H03M 13/13; H03M 13/1111; H03M 13/2906; H04L 1/0041;
(Continued)

(56) References Cited

U.S. PATENT DOCUMENTS

| | | | |
|---|---|---|---|
| 9,203,525 B2 | 12/2015 | Shen et al. | |
| 2014/0365842 A1* | 12/2014 | Li | H03M 13/1111 714/752 |

(Continued)

FOREIGN PATENT DOCUMENTS

| | | |
|---|---|---|
| CN | 102739363 A | 10/2012 |
| CN | 103281166 A | 9/2013 |

(Continued)

OTHER PUBLICATIONS

Qualcomm Inc.:"Design of Polar codes for control channel", 3GPP draftR1-1700832, RAN WG 1:Spokane, USA; Jan. 16-20, 2017, XP051208351 5 pages.
(Continued)

*Primary Examiner* — Shelly A Chase
(74) *Attorney, Agent, or Firm* — Fish & Richardson P.C.

(57) ABSTRACT

Embodiments of this application provide a method for transmitting encoded information. A communication device obtains K bits of information, and generates a to-be-encoded sequence $u_1^N$, wherein N is a length of the sequence. The device encodes the sequence $u_1^N$ in an encoding process, to obtain an output sequence, and transmits the output sequence. In the sequence $u_1^N$, each of the N bits corresponds to a subchannel, and each subchannel has a reliability. The K information bits, a quantity J of first-type auxiliary bits, and a quantity J' of second-type auxiliary bits are placed in K'=K+J+J' bit positions of the sequence $u_1^N$ according to reliabilities of the subchannels. Since the positions of the information bits and the auxiliary bits are
(Continued)

pre-determined and not affected by subsequent encoding and rate-matching, overheads of real-time reliability calculation are effectively reduced, time is saved, and delay is reduced.

20 Claims, 5 Drawing Sheets

Related U.S. Application Data continuation of application No. PCT/CN2018/080392, filed on Mar. 24, 2018.

(52) U.S. Cl.
CPC .......... H04L 1/0057 (2013.01); H04L 1/0061 (2013.01); H04L 1/0068 (2013.01); *H03M 13/09* (2013.01)

(58) Field of Classification Search
CPC ... H04L 1/0056; H04L 1/0057; H04L 1/0061; H04L 1/0068
See application file for complete search history.

(56) References Cited

U.S. PATENT DOCUMENTS

| | | |
|---|---|---|
| 2015/0194987 A1 | 7/2015 | Li et al. |
| 2015/0295593 A1* | 10/2015 | Trifonov ............... H03M 13/13 714/776 |
| 2016/0182187 A1 | 6/2016 | Kim et al. |
| 2016/0227392 A1 | 8/2016 | Palin et al. |
| 2018/0287738 A1 | 10/2018 | Xu et al. |
| 2018/0367250 A1 | 12/2018 | Li et al. |
| 2019/0068316 A1 | 2/2019 | Zhang et al. |
| 2019/0181983 A1 | 6/2019 | Ye et al. |

FOREIGN PATENT DOCUMENTS

| | | |
|---|---|---|
| CN | 103684477 A | 3/2014 |
| CN | 105376830 A | 3/2016 |
| CN | 105680883 A | 6/2016 |
| CN | 106230555 A | 12/2016 |
| CN | 107342844 A | 11/2017 |
| EP | 3396862 A1 | 10/2018 |
| JP | 2016506647 A | 3/2016 |
| KR | 20150133254 A | 11/2015 |

OTHER PUBLICATIONS

Huawei, HiSilicon, Polar Coding Design for Control Channel. 3GPP TSG RAN WG1 Meeting #88bis, Spokane, USA, Apr. 3-7, 2017, R1-1704247, 14 pages.

Huawei, HiSilicon, Summary of polar code design for control channels. 3GPP TSG RAN WG1 Ad-Hoc Meeting, Spokane, USA, Jan. 16-20, 2017, R1-1700088, 10 pages.

Huawei et al.,"Polar Code Construction for NR",3GPP TSG RAN WG1 Meeting #86bis R1-1608862,Lisbon, Portugal, Oct. 10-14, 2016,total 8 pages.

NTT Docomo,"Performance evaluation of Polar codes",3GPP TSG RAN WG1 Meeting #88 R1-1702849,Athens, Greece Feb. 13-17, 2017,total 5 pages.

* cited by examiner

CHANNEL CODING METHOD AND APPARATUS IN COMMUNICATION SYSTEM

CROSS-REFERENCE TO RELATED APPLICATIONS

This application is a continuation of U.S. patent application Ser. No. 16/398,282, filed on Apr. 30, 2019, which is a continuation of International Patent Application No. PCT/CN2018/080392, filed on Mar. 24, 2018. The International Patent Application claims priority to Chinese Patent Application No. 201710184933.4, filed on Mar. 24, 2017. All of the afore-mentioned patent applications are hereby incorporated by reference in their entireties.

TECHNICAL FIELD

This application relates to communications technologies, and in particular, to a polar code encoding method and apparatus, and a polar code decoding method and apparatus.

BACKGROUND

Polar code is a new type of channel encoding scheme proposed by Professor E. Arikan in 2008. The polar code is designed based on channel polarization, and is the first constructive encoding scheme that can be proven, through a strict mathematical method, to achieve a channel capacity. The polar code is a type of linear block code. A generator matrix of the polar code is $G_N$, and an encoding process of the polar code is $$x_1^N = u_1^N G_N,$$

where $u_1^N = (u_1, u_2, \ldots u_N)$ is an N-bit binary row vector (namely, a code length of $u_1^N$ is N), $x_1^N$ is an N-bit encoded row vector, $G_N$ is an N×N matrix, and $G_N = F_2^{\oplus (\log_2(N))}$. Herein, $$F_2 = \begin{bmatrix} 1 & 0 \\ 1 & 1 \end{bmatrix},$$

and $F_2^{\oplus (\log_2(N))}$ is defined as a Kronecker product of a quantity $\log_2 N$ of matrices $F_2$. For example, $$F = \begin{bmatrix} 1 & 0 \\ 1 & 1 \end{bmatrix}$$

$$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

In the polar code encoding process, some bits in $u_1^N$ are used to carry information, and are referred to as information bits. Each bit in $u_1^N$ has an index, and an index set of the information bits is marked as A. The other bits are set to a fixed value (referred to as fixed bits) pre-agreed on by a receive end (receiving device) and a transmit end (transmitting device), and an index set of these bits is represented by a complementary set $A^c$ of A. Generally, these fixed bits are usually set to 0. Alternatively, a fixed bit sequence may be randomly set as pre-agreed on by the receive end and the transmit end. Therefore, an encoding output of the polar code may be simplified as $x_1^N = u_A G_N(A)$. Herein, $u_A$ is an information bit set in $u_1^N$, and $u_A$ is a row vector of a length K, in other words, |A|=K, where |A| represents a quantity of elements in the set A, and K is an information block size. $G_N(A)$ is a submatrix obtained from rows in the matrix $G_N$ that are corresponding to indexes in the set A, and $G_N(A)$ is a K row×N column matrix. A polar code construction process is a process of selecting the set A, and the selection of set A determines polar code performance.

To improve the polar code performance, check precoding is usually performed on information bits before performing the polar encoding. This is called check precoding cascaded polar encoding. There are two common check precoding manners: cyclic redundancy check (CRC) cascaded polar encoding and parity check (PC) cascaded polar encoding. It may be considered that both CRC bits and PC bits are auxiliary bits. Generally, a CRC bit is usually considered as a special information bit, and is placed on a subchannel (bit position) that is more reliable than the information bit, but PC bit position selection has not yet been defined. In the prior art, an auxiliary bit position is usually determined based on reliability or a row weight of each subchannel that is calculated in real time, and this is time-consuming and is not conducive to rapid implementation. The embodiments of the present application provide a solution for rapidly determining an auxiliary bit position, so as to reduce encoding delay or decoding delay.

SUMMARY

This application provides a polar code encoding method and apparatus, and a polar code decoding method and apparatus, to rapidly determine positions of second-type auxiliary bits including PC bits.

A first aspect of this application provides an encoding method. A mother code length used in an encoding process is N, a code rate is R, a code length obtained after encoding is M, a quantity of information bits is K, a quantity of first-type auxiliary bits is J, a quantity of second-type auxiliary bits is J', K+J+J'=K', and the encoding method includes:

selecting, by a sending device, K' subchannels from M subchannels to transmit the K information bits, the J first-type auxiliary bits, and the J' second-type auxiliary bits, where reliability of any one of the K' subchannels is greater than or equal to reliability of any one of remaining M-K' subchannels;

performing, by the sending device, polar encoding on a to-be-encoded sequence based on positions of subchannels corresponding to the J first-type auxiliary bits, positions of subchannels corresponding to the J' second-type auxiliary bits, and positions of subchannels corresponding to the K information bits; and sending, by the sending device, an encoded sequence.

In this solution, the J' second-type auxiliary bits are selected directly based on reliability ranking or subchannel number ranking or a prestored table, so that rapid locating
} can be implemented, and an encoding delay and a decoding delay can be effectively reduced.

In a possible implementation, when N>M, the method further includes: selecting, by the sending device, subchannels corresponding to N-M bits in a mother code sequence as punctured subchannels.

In a possible implementation, the quantity J' of second-type auxiliary bits is preconfigured; or the quantity J' of second-type auxiliary bits meets J'=integer($\log_2$(N-K)+C), where integer( ) represents a round-up operation, a round-down operation, or a round-off operation, and C is a constant integer; or the quantity J' of second-type auxiliary bits meets J'=integer($\log_2$(N-K-J)+C), where integer( ) represents a round-up operation, a round-down operation, or a round-off operation, and C is a constant integer; or the quantity J' of second-type auxiliary bits meets J'=integer($\log_2$(min(N-K,K))+C), where integer( ) represents a round-up operation, a round-down operation, or a round-off operation, and C is a constant integer; or the quantity J' of second-type auxiliary bits meets J'=integer($\log_2$(min(N-K-J,K))+C), where integer( ) represents a round-up operation, a round-down operation, or a round-off operation, and C is a constant integer; or the quantity J' of second-type auxiliary bits meets J'=integer($\log_2$(M-K)+C), where integer( ) represents a round-up operation, a round-down operation, or a round-off operation, and C is a constant integer; or the quantity J' of second-type auxiliary bits meets J'=integer($\log_2$(N-K-J)+C), where integer( ) represents a round-up operation, a round-down operation, or a round-off operation, and C is a constant integer; or the quantity J' of second-type auxiliary bits meets J'=integer($\log_2$(min(M-K,K))+C), where integer( ) represents a round-up operation, a round-down operation, or a round-off operation, and C is a constant integer; or the quantity J' of second-type auxiliary bits meets J'=integer($\log_2$(min(M-K-J,K))+C), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels. This method is simpler and more intuitive.

In a possible implementation, the sending device sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In this table lookup manner, overheads of real-time row weight calculation and reliability calculation are avoided, the encoding process is accelerated, and calculation overheads and a delay are reduced.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels. $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are first J' subchannels that are not punctured subchannels and that are ranked in descending order of reliability in subchannels with a Hamming weight $H_{min}$ in the K' subchannels. $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, . . . , or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the sending device selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the sending device determines $W_{min}$ based on K' and N. Specifically, the sending device selects $W_{min}$ corresponding to K' from a prestored table based on K' and N. The prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, . . . , or T, t is the row weight transition point index corresponding to K', and T is a positive integer.

In a possible implementation, the prestored table is some or all content of Table 4.

In a possible implementation, after $W_{min}$ is determined, the method further includes: dividing a sequence corresponding to a row weight $W_{min}$ in prestored position number sequences of a mother code length $N_{max}$ that are corresponding to different row weights by $N_{max}/N$, reserving an integer quotient, and sequentially selecting J' position numbers that are not of punctured subchannels from the reserved integer quotient in a left-to-right order, where subchannels corresponding to the J' position numbers are used to transmit the J' second-type auxiliary bits.

In a possible implementation, after $W_{min}$ is determined, the method further includes: reserving position numbers less than or equal to N for a sequence corresponding to a row weight $W_{min} \times N_{max}/N$ in prestored position number sequences of a mother code length $N_{max}$ that are corresponding to different row weights, and sequentially selecting J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the sending device selects a row weight transition point index t corresponding to K' from a prestored table based on K' and N. The prestored table is used to represent a correspondence between the row weight transition point index and the T row weight transition points in different mother code lengths. T is a positive integer, and K' meets $K_t \leq K' < K_{t-1}$. The sending device selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order. Subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N–X, and X is the J' position numbers.

In a possible implementation, the first-type auxiliary bits are CRC bits.

In a possible implementation, the second-type auxiliary bits is PC bits.

A second aspect of this application provides a decoding method. A mother code length used in a decoding process is N, a code rate is R, a code length obtained after encoding is M, a quantity of information bits is K, a quantity of first-type auxiliary bits is J, a quantity of second-type auxiliary bits is J', K+J+J'=K', and the decoding method includes:

determining, by a receiving device, positions of the information bits, the first-type auxiliary bits, and the second-type auxiliary bits based on the mother code length N, the code length M, and the quantity K of information bits, where N is an integral power of 2, and M and K are positive integers; and decoding a to-be-decoded sequence based on positions of the information bits, punctured bits, the first-type auxiliary bits, and the second-type auxiliary bits.

In a possible implementation, when N>M, the method further includes: selecting, by the receiving device, subchannels corresponding to N-M bits in a mother code sequence as punctured subchannels.

In a possible implementation, the quantity J' of second-type auxiliary bits is preconfigured; or the quantity J' of second-type auxiliary bits meets J'=integer($\log_2$(N–K)+C), where integer( ) represents a round-up operation, a round-down operation, or a round-off operation, and C is a constant integer; or the quantity J' of second-type auxiliary bits meets J'=integer($\log_2$(N–K–J)+C), where integer( ) represents a round-up operation, a round-down operation, or a round-off operation, and C is a constant integer; or the quantity J' of second-type auxiliary bits meets J'=integer($\log_2$(min(N–K,K))+C), where integer( ) represents a round-up operation, a round-down operation, or a round-off operation, and C is a constant integer; or the quantity J' of second-type auxiliary bits meets J'=integer($\log_2$(min(N–K–J,K))+C), where integer( ) represents a round-up operation, a round-down operation, or a round-off operation, and C is a constant integer; or the quantity J' of second-type auxiliary bits meets J'=integer($\log_2$(M–K)+C), where integer( ) represents a round-up operation, a round-down operation, or a round-off operation, and C is a constant integer; or the quantity J' of second-type auxiliary bits meets J'=integer($\log_2$(N–K–J)+C), where integer( ) represents a round-up operation, a round-down operation, or a round-off operation, and C is a constant integer; or the quantity J' of second-type auxiliary bits meets J'=integer($\log_2$(min(M–K,K))+C), where integer( ) represents a round-up operation, a round-down operation, or a round-off operation, and C is a constant integer; or the quantity J' of second-type auxiliary bits meets J'=integer($\log_2$(min(M–K–J,K))+C), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels.

In a possible implementation, the receiving device sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels, where $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are first J' subchannels that are not punctured subchannels and that are ranked in descending order of reliability in subchannels with a Hamming weight $H_{min}$ in the K' subchannels. $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, ..., or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the receiving device selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the receiving device determines $W_{min}$ based on K' and N. Specifically, the receiving device selects $W_{min}$ corresponding to K' from a prestored table based on K' and N. The prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, ..., or T, t is the row weight transition point index corresponding to K', and T is a positive integer.

In a possible implementation, the prestored table is some or all content of Table 4.

In a possible implementation, after $W_{min}$ is determined, the method further includes: dividing a sequence corresponding to a row weight $W_{min}$ in prestored position number sequences of a mother code length $N_{max}$ that are corresponding to different row weights by $N_{max}/N$, reserving an integer quotient, and sequentially selecting J' position numbers that are not of punctured subchannels from the reserved integer quotient in a left-to-right order, where subchannels corresponding to the J' position numbers are used to transmit the J' second-type auxiliary bits.

In a possible implementation, after $W_{min}$ is determined, the method further includes: reserving position numbers less than or equal to N for a sequence corresponding to a row weight $W_{min} \times N_{max}/N$ in prestored position number sequences of a mother code length $N_{max}$ that are corresponding to different row weights, and sequentially selecting J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the receiving device selects a row weight transition point index t corresponding to K' from a prestored table based on K' and N. The prestored table is used to represent a correspondence between the row weight transition point index and the T row weight transition points in different mother code lengths, T is a positive integer, and K' meets $K_t \leq K' < K_{t-1}$. The receiving device selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N−X, and X is the J' position numbers.

In a possible implementation, the first-type auxiliary bits are CRC bits.

In a possible implementation, the second-type auxiliary bits are PC bits.

A third aspect of this application provides an encoding apparatus. A mother code length used in an encoding process is N, a code rate is R, a code length obtained after encoding is M, a quantity of information bits is K, a quantity of first-type auxiliary bits is J, a quantity of second-type auxiliary bits is J', K+J+J'=K', and the encoding apparatus includes:

an encoding module 41, configured to perform polar encoding on a to-be-encoded sequence, where a mother code length of a polar code is N, and the to-be-encoded sequence includes frozen bits, first-type auxiliary bits, second-type auxiliary bits, and information bits;

a determining module 42, configured to determine subchannels corresponding to the frozen bits, the first-type auxiliary bits, the second-type auxiliary bits, and the information bits, where the determining module 42 is further configured to determine values of the first-type auxiliary bits and the second-type auxiliary bits; and a sending module 43, configured to send an encoded sequence.

In a possible implementation, when N>M, the determining module selects subchannels corresponding to N−M bits in a mother code sequence as punctured subchannels.

In a possible implementation, the quantity J' of second-type auxiliary bits is preconfigured; or the quantity J' of second-type auxiliary bits meets J'=integer($\log_2(N-K)+C$), where integer( ) represents a round-up operation, a round-down operation, or a round-off operation, and C is a constant integer; or the quantity J' of second-type auxiliary bits meets J'=integer($\log_2(N-K-J)+C$), where integer( ) represents a round-up operation, a round-down operation, or a round-off operation, and C is a constant integer; or the quantity J' of second-type auxiliary bits meets J'=integer($\log_2(\min(N-K,K))+C$), where integer( ) represents a round-up operation, a round-down operation, or a round-off operation, and C is a constant integer; or the quantity J' of second-type auxiliary bits meets J'=integer($\log_2$(min(N−K−J,K))+C), where integer( ) represents a round-up operation, a round-down operation, or a round-off operation, and C is a constant integer; or the quantity J' of second-type auxiliary bits meets J'=integer($\log_2$(M−K)+C), where integer( ) represents a round-up operation, a round-down operation, or a round-off operation, and C is a constant integer; or the quantity J' of second-type auxiliary bits meets J'=integer($\log_2$(M−K−J)+C), where integer( ) represents a round-up operation, a round-down operation, or a round-off operation, and C is a constant integer; or the quantity J' of second-type auxiliary bits meets J'=integer($\log_2$(min(M−K,K))+C), where integer( ) represents a round-up operation, a round-down operation, or a round-off operation, and C is a constant integer; or the quantity J' of second-type auxiliary bits meets J'=integer($\log_2$(min(M−K−J,K))+C), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels.

In a possible implementation, the determining module sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels. $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are first J' subchannels that are not punctured subchannels and that are ranked in descending order of reliability in subchannels with a Hamming weight $H_{min}$ in the K' subchannels. $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, . . . , or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the determining module selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the determining module determines $W_{min}$ based on K' and N. Specifically, the determining module selects $W_{min}$ corresponding to K' from a prestored table based on K' and N, where the prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, . . . , or T, t is the row weight transition point index corresponding to K', and T is a positive integer.

In a possible implementation, the prestored table is some or all content of Table 4.

In a possible implementation, after determining $W_{min}$, the determining module divides a sequence corresponding to a row weight $W_{min}$ in prestored position number sequences of a mother code length $N_{max}$ that are corresponding to different row weights by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, after determining $W_{min}$, the determining module reserves position numbers less than or equal to N for a sequence corresponding to a row weight $W_{min} \times N_{max}/N$ in prestored position number sequences of a mother code length $N_{max}$ that are corresponding to different row weights, and sequentially selects J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the determining module selects a row weight transition point index t corresponding to K' from a prestored table based on K' and N. The prestored table is used to represent a correspondence between the row weight transition point index and the T row weight transition points in different mother code lengths, T is a positive integer, and K' meets $K_t \leq K' < K_{t-1}$. The determining module selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order. Subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N−X, and X is the J' position numbers.

In a possible implementation, the first-type auxiliary bits are CRC bits.

In a possible implementation, the second-type auxiliary bits are PC bits.

A fourth aspect of this application provides a receiving apparatus. A mother code length used in a decoding process is N, a code rate is R, a code length obtained after encoding is M, a quantity of information bits is K, a quantity of first-type auxiliary bits is J, a quantity of second-type auxiliary bits is J', K+J+J'=K', and the receiving apparatus includes:

an obtaining module 51, configured to obtain a to-be-decoded sequence;

a determining module 52, configured to determine subchannels corresponding to frozen bits, first-type auxiliary bits, second-type auxiliary bits, punctured bits, and information bits; and a decoding module 53, configured to perform polar decoding on the received to-be-decoded sequence to obtain a decoded sequence.

In a possible implementation, when N>M, the determining module selects subchannels corresponding to N−M bits in a mother code sequence as punctured subchannels.

In a possible implementation, the quantity J' of second-type auxiliary bits is preconfigured; or the quantity J' of second-type auxiliary bits meets J'=integer($\log_2$(N−K)+C), where integer( ) represents a round-up operation, a round-down operation, or a round-off operation, and C is a constant integer; or the quantity J' of second-type auxiliary bits meets J'=integer($\log_2$(N−K−J)+C), where integer( ) represents a round-up operation, a round-down operation, or a round-off operation, and C is a constant integer; or the quantity J' of second-type auxiliary bits meets J'=integer($\log_2$(min(N−K,K))+C), where integer( ) represents a round-up operation, a round-down operation, or a round-off operation, and C is a constant integer; or the quantity J' of second-type auxiliary bits meets J'=integer($\log_2$(min(N−K−J,K))+C), where integer( ) represents a round-up operation, a round-down operation, or a round-off operation, and C is a constant integer; or the quantity J' of second-type auxiliary bits meets J'=integer($\log_2$(M−K)+C), where integer( ) represents a round-up operation, a round-down operation, or a round-off operation, and C is a constant integer; or the quantity J' of second-type auxiliary bits meets J'=integer($\log_2$(M−K−J)+C), where integer( ) represents a round-up operation, a round-down operation, or a round-off operation, and C is a constant integer; or the quantity J' of second-type auxiliary bits meets J'=integer($\log_2$(min(M−K,K))+C), where integer( ) represents a round-up operation, a round-down operation, or a round-off operation, and C is a constant integer; or the quantity J' of second-type auxiliary bits meets J'=integer($\log_2$(min(M−K−J,K))+C), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels.

In a possible implementation, the determining module sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels. $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are first J' subchannels that are not punctured subchannels and that are ranked in descending order of reliability in subchannels with a Hamming weight $H_{min}$ in the K' subchannels, $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, . . . , or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the determining module selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the determining module determines $W_{min}$ based on K' and N. Specifically, the determining module selects $W_{min}$ corresponding to K' from a prestored table based on K' and N, where the prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, . . . , or T, t is the row weight transition point index corresponding to K', and T is a positive integer.

In a possible implementation, the prestored table is some or all content of Table 4.

In a possible implementation, after determining $W_{min}$, the determining module divides a sequence corresponding to a row weight $W_{min}$ in prestored position number sequences of a mother code length $N_{max}$ that are corresponding to different row weights by $N_{max}/N$. The determining module reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, after determining $W_{min}$, the determining module reserves position numbers less than or equal to N for a sequence corresponding to a row weight $W_{min} \times N_{max}/N$ in prestored position number sequences of a mother code length $N_{max}$ that are corresponding to different row weights, and sequentially selects J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the determining module selects a row weight transition point index t corresponding to K' from a prestored table based on K' and N. The prestored table is used to represent a correspondence between the row weight transition point index and the T row weight transition points in different mother code lengths, T is a positive integer, and K' meets $K_t \leq K' < K_{t-1}$. The determining module selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N−X, and X is the J' position numbers.

In a possible implementation, the first-type auxiliary bits are CRC bits.

In a possible implementation, the second-type auxiliary bits are PC bits.

A fifth aspect of this application provides an encoding apparatus. A mother code length used in an encoding process is N, a code rate is R, a code length obtained after encoding is M, a quantity of information bits is K, a quantity of first-type auxiliary bits is J, a quantity of second-type auxiliary bits is J', K+J+J'=K', and the encoding apparatus includes:

a memory 1101, configured to store an execution instruction; and a processor 1102, configured to execute the execution instruction stored in the memory, where the processor is configured to perform polar encoding on a to-be-encoded sequence, where a mother code length of a polar code is N, and the to-be-encoded sequence includes frozen bits, first-type auxiliary bits, second-type auxiliary bits, and information bits, where the processor is further configured to determine subchannels corresponding to the frozen bits, the first-type auxiliary bits, the second-type auxiliary bits, and the information bits; and the processor is further configured to determine values of the first-type auxiliary bits and the second-type auxiliary bits.

In a possible implementation, when the processor is implemented by hardware, the memory may not be required.

In a possible implementation, a transmitter of the encoding apparatus is configured to send an encoded sequence.

In a possible implementation, when N>M, the processor selects subchannels corresponding to N−M bits in a mother code sequence as punctured subchannels.

In a possible implementation, the quantity J' of second-type auxiliary bits is preconfigured; or the quantity J' of second-type auxiliary bits meets J'=integer($\log_2(N-K)+C$), where integer( ) represents a round-up operation, a round-down operation, or a round-off operation, and C is a constant integer; or the quantity J' of second-type auxiliary bits meets J'=integer($\log_2(N-K-J)+C$), where integer( ) represents a round-up operation, a round-down operation, or a round-off operation, and C is a constant integer; or the quantity J' of second-type auxiliary bits meets J'=integer($\log_2(\min(N-K,K))+C$), where integer( ) represents a round-up operation, a round-down operation, or a round-off operation, and C is a constant integer; or the quantity J' of second-type auxiliary bits meets J'=integer($\log_2(\min(N-K-J,K))+C$), where integer( ) represents a round-up operation, a round-down operation, or a round-off operation, and C is a constant integer; or the quantity J' of second-type auxiliary bits meets J'=integer($\log_2(M-K)+C$), where integer( ) represents a round-up operation, a round-down operation, or a round-off operation, and C is a constant integer; or the quantity J' of second-type auxiliary bits meets J'=integer($\log_2(M-K-J)+C$), where integer( ) represents a round-up operation, a round-down operation, or a round-off operation, and C is a constant integer; or the quantity J' of second-type auxiliary bits meets J'=integer($\log_2(\min(M-K,K))+C$), where integer( ) represents a round-up operation, a round-down operation, or a round-off operation, and C is a constant integer; or the quantity J' of second-type auxiliary bits meets J'=integer($\log_2(\min(M-K-J,K))+C$), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels.

In a possible implementation, the processor sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels, where $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are or first J' subchannels that are not punctured subchannels and that are ranked in descending order of reliability in subchannels with a Hamming weight $H_{min}$ in the K' subchannels. $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, . . . , or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the processor selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the processor determines $W_{min}$ based on K' and N. Specifically, the processor selects $W_{min}$ corresponding to K' from a prestored table based on K' and N. The prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, . . . , or T, t is the row weight transition point index corresponding to K', and T is a positive integer.

In a possible implementation, the prestored table is some or all content of Table 4.

In a possible implementation, after determining $W_{min}$, the processor divides a sequence corresponding to a row weight $W_{min}$ in prestored position number sequences of a mother code length $N_{max}$ that are corresponding to different row weights by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, after determining $W_{min}$, the processor reserves position numbers less than or equal to N for a sequence corresponding to a row weight $W_{min} \times N_{max}/N$ in prestored position number sequences of a mother code length $N_{max}$ that are corresponding to different row weights, and sequentially selects J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the processor selects a row weight transition point index t corresponding to K' from a prestored table based on K' and N. The prestored table is used to represent a correspondence between the row weight transition point index and the T row weight transition points in different mother code lengths, T is a positive integer, and K' meets $K_t \leq K' < K_{t-1}$. The processor selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N−X, and X is the J' position numbers.

In a possible implementation, the first-type auxiliary bits are CRC bits.

In a possible implementation, the second-type auxiliary bits are PC bits.

A sixth aspect of this application provides a decoding apparatus. A mother code length used in a decoding process is N, a code rate is R, a code length obtained after encoding is M, a quantity of information bits is K, a quantity of first-type auxiliary bits is J, a quantity of second-type auxiliary bits is J', K+J+J'=K', and the decoding apparatus includes:

a memory 1201, configured to store an execution instruction, where the memory may be a flash (flash memory); and a processor 1202, configured to execute the execution instruction stored in the memory, where the processor is configured to determine subchannels corresponding to frozen bits, first-type auxiliary bits, second-type auxiliary bits, punctured bits, and information bits, where the processor is further configured to perform polar decoding on a received to-be-decoded sequence to obtain a decoded sequence.

In a possible implementation, when the processor is implemented by hardware, the memory may not be required.

In a possible implementation, the apparatus further includes a receiver, configured to receive a to-be-decoded signal or the to-be-decoded sequence.

In a possible implementation, when N>M, the processor selects subchannels corresponding to N−M bits in a mother code sequence as punctured subchannels.

In a possible implementation, the quantity J' of second-type auxiliary bits is preconfigured; or the quantity J' of second-type auxiliary bits meets J'=integer($\log_2$(N−K)+C), where integer( ) represents a round-up operation, a round-down operation, or a round-off operation, and C is a constant integer; or the quantity J' of second-type auxiliary bits meets J'=integer($\log_2$(N−K−J)+C), where integer( ) represents a round-up operation, a round-down operation, or a round-off operation, and C is a constant integer; or the quantity J' of second-type auxiliary bits meets J'=integer($\log_2$(min(N−K,K))+C), where integer( ) represents a round-up operation, a round-down operation, or a round-off operation, and C is a constant integer; or the quantity J' of second-type auxiliary bits meets J'=integer($\log_2$(min(N−K−J,K))+C), where integer( ) represents a round-up operation, a round-down operation, or a round-off operation, and C is a constant integer; or the quantity J' of second-type auxiliary bits meets J'=integer($\log_2$(M−K)+C), where integer( ) represents a round-up operation, a round-down operation, or a round-off operation, and C is a constant integer; or the quantity J' of second-type auxiliary bits meets J'=integer($\log_2$(M−K−J)+C), where integer( ) represents a round-up operation, a round-down operation, or a round-off operation, and C is a constant integer; or the quantity J' of second-type auxiliary bits meets J'=integer($\log_2$(min(M−K,K))+C), where integer( ) represents a round-up operation, a round-down operation, or a round-off operation, and C is a constant integer; or the quantity J' of second-type auxiliary bits meets J'=integer($\log_2$(min(M−K−J,K))+C), where integer( ) represents a round-up operation, a round-down operation, or a round-off operation, and C is a constant integer.

In a possible implementation, the subchannels corresponding to the J' second-type auxiliary bits are first J' subchannels that are not punctured subchannels and that are ranked in descending order of subchannel numbers in the K' subchannels, or first J' subchannels that are not punctured subchannels and that are ranked in descending order of reliability in the K' subchannels.

In a possible implementation, the processor sequentially selects, based on K' and N, J' numbers that are not of punctured subchannels from a prestored table in a left-to-right order, where subchannels corresponding to the J' numbers are used to transmit the J' second-type auxiliary bits.

In a possible implementation, the prestored table is some or all content of Table 1 or some or all content of Table 2.

In a possible implementation, the subchannels corresponding to the J' second-type auxiliary bits are first J' subchannels that are not punctured subchannels and that are ranked in descending order of subchannel numbers in subchannels with a row weight $W_{min}$ in the K' subchannels. Alternatively, the subchannels corresponding to the J' second-type auxiliary bits are first J' subchannels that are not punctured subchannels and that are ranked in descending order of reliability in subchannels with a row weight $W_{min}$ in the K' subchannels. $W_{min}$ is a minimum row weight of the K' subchannels.

In a possible implementation, the subchannels corresponding to the J' second-type auxiliary bits are first J' subchannels that are not punctured subchannels and that are ranked in descending order of subchannel numbers in subchannels with a Hamming weight $H_{min}$ in the K' subchannels. Alternatively, the subchannels corresponding to the J' second-type auxiliary bits are first J' subchannels that are not punctured subchannels and that are ranked in descending order of reliability in subchannels with a Hamming weight $H_{min}$ in the K' subchannels. $H_{min}$ is a minimum Hamming weight of the K' subchannels, and the minimum Hamming weight $H_{min}=\log_2 W_{min}$.

In a possible implementation, $W_{min}=2^{t+D}$, where D is a constant, t=1, 2, . . . , or T, t is a row weight transition point index corresponding to K', K' meets $K_t \leq K' < K_{t-1}$, $K_t$ is a subchannel quantity corresponding to a $t^{th}$ row weight transition point, and T is a positive integer.

In a possible implementation, D=0.

In a possible implementation, the processor selects the row weight transition point index corresponding to K' from a prestored table based on K' and N. The prestored table is used to represent a correspondence between the row weight transition point index and the T row weight transition points in different mother code lengths, and K' meets $K_t \leq K' < K_{t-1}$.

In a possible implementation, the prestored table is some or all content of Table 3.

In a possible implementation, the processor determines $W_{min}$ based on K' and N. Specifically, the processor selects $W_{min}$ corresponding to K' from a prestored table based on K' and N. The prestored table is used to represent a correspondence between $W_{min}$, the T row weight transition points in the different mother code lengths, and subchannel quantities that are in one-to-one correspondence with the T row weight transition points, K' meets $K_t \leq K' < K_{t-1}$, $K_t$ is the subchannel quantity corresponding to the $t^{th}$ row weight transition point, t=1, 2, . . . , or T, t is the row weight transition point index corresponding to K', and T is a positive integer.

In a possible implementation, the prestored table is some or all content of Table 4.

In a possible implementation, after determining $W_{min}$, the processor divides a sequence corresponding to a row weight $W_{min}$ in prestored position number sequences of a mother code length $N_{max}$ that are corresponding to different row weights by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, after determining $W_{min}$, the processor reserves position numbers less than or equal to N for a sequence corresponding to a row weight $W_{min} \times N_{max}/N$ in prestored position number sequences of a mother code length $N_{max}$ that are corresponding to different row weights. The processor sequentially selects J' position numbers that are not of punctured subchannels from the reserved position numbers less than or equal to N in a left-to-right order, where subchannels corresponding to the J' position numbers are used to transmit the J' second-type auxiliary bits.

In a possible implementation, $N_{max}=512$, and the prestored position number sequences of the mother code length $N_{max}$ that are corresponding to the different row weights are some or all content of Table 5, or some or all content of Table 6.

In a possible implementation, $N_{max}=1024$, and the prestored position number sequences of the mother code length $N_{max}$ that are corresponding to the different row weights are some or all content of Table 7, or some or all content of Table 8.

In a possible implementation, the processor selects a row weight transition point index t corresponding to K' from a prestored table based on K' and N. The prestored table is used to represent a correspondence between the row weight transition point index and the T row weight transition points in different mother code lengths, T is a positive integer, and K' meets $K_t \leq K' < K_{t-1}$. The processor selects prestored position number sequences of a mother code length $N_{max}$ that are corresponding to different indexes, divides the position number sequences by $N_{max}/N$, reserves an integer quotient, and sequentially selects J' position numbers that are not of punctured subchannels from the reserved integer quotient in a left-to-right order, where subchannels corresponding to the J' position numbers are used to transmit the J' second-type auxiliary bits.

In a possible implementation, the prestored table is some or all content of Table 3.

In a possible implementation, $N_{max}=512$, and the prestored position number sequences of the mother code length $N_{max}$ that are corresponding to the different indexes are some or all content of Table 9, or some or all content of Table 10.

In a possible implementation, $N_{max}=1024$, and the prestored position number sequences of the mother code length $N_{max}$ that are corresponding to the different indexes are some or all content of Table 11, or some or all content of Table 12.

In a possible implementation, subchannel numbers corresponding to the J' position numbers are N–X, and X is the J' position numbers.

In a possible implementation, the first-type auxiliary bit are CRC bits.

In a possible implementation, the second-type auxiliary bits are PC bits.

A seventh aspect of this application provides a computer readable storage medium. The computer readable storage medium stores a computer-executable instruction, and when at least one processor of a sending device executes the computer-executable instruction, the sending device executes the data encoding method provided in the first aspect or the various implementations of the first aspect.

An eighth aspect of this application provides a computer readable storage medium. The computer readable storage medium stores a computer-executable instruction, and when at least one processor of a receiving device executes the computer-executable instruction, the receiving device executes the data decoding method provided in the second aspect or the various implementations of the second aspect.

A ninth aspect of this application provides a computer program product. The computer program product includes a computer-executable instruction, and the computer-executable instruction is stored in a computer readable storage medium. At least one processor of a sending device may read the computer-executable instruction from the computer readable storage medium, and the at least one processor executes the computer-executable instruction, so that the sending device implements the data encoding method provided in the first aspect or the various implementations of the first aspect.

A tenth aspect of this application provides a computer program product. The computer program product includes a computer-executable instruction, and the computer-executable instruction is stored in a computer readable storage medium. At least one processor of a receiving device may read the computer-executable instruction from the computer readable storage medium, and the at least one processor executes the computer-executable instruction, so that the receiving device implements the data decoding method provided in the second aspect or the various implementations of the second aspect.

DESCRIPTION OF EMBODIMENTS

Generally, a CRC bit may be considered as a first-type auxiliary bit, and a PC bit and the like are considered as second-type auxiliary bits. In some cases, some CRC bits may also be considered as second-type auxiliary bits, and this is not limited herein.

To avoid a delay caused in determining an auxiliary bit position when minimum row weight $W_{min}$ is determined through real-time calculation and searching, the embodiments of this application provide a method for determining an auxiliary bit position based on a prestored table. In particular, an auxiliary bit position can be selected based on reliabilities (including polarization weight, Gaussian approximation, and other types of reliability) or based on subchannel sequence numbers. In specific implementation, optionally, an auxiliary bit position may be determined based on a minimum Hamming weight. The minimum Hamming weight $H_{min}$ may be calculated by using the $W_{min}$, to be specific, $H_{min}=\log_2 W_{min}$, and therefore the two are essentially equivalent. In this application, the minimum row weight is used for description, but certainly, the minimum Hamming weight can also be used in a similar manner.

Figure 1:
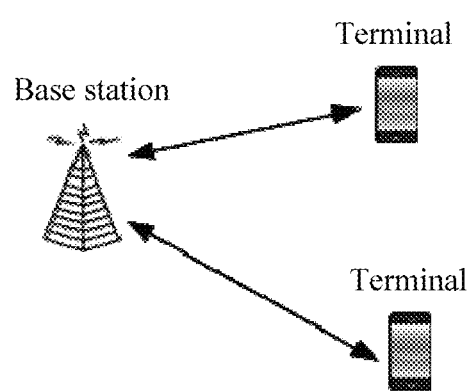
FIG. 1 is a schematic diagram of a communication system in which data encoding method or data decoding method according to embodiments of this application can be applied.

The technical solutions in embodiments of this application can be applied to various communications systems, such as WiFi systems and the fifth generation (5G) communications systems currently in development. FIG. 1 is a schematic diagram of a communication system in which a data sending method or a data receiving method according to embodiments of this application can be applied. As shown in FIG. 1, for a cellular network, the system includes a network device (such as a base station) and a terminal device, or, for a WiFi network, the system includes a WiFi access point and a WiFi terminal. Quantity of network devices and quantity of terminals are not limited. When the network device transmits a downlink signal to the terminal, polar code or other channel encoding processes may be performed. Polar code may also be used in uplink signal transmission. The subsequently provided method can be used in both uplink data transmission and downlink data transmission.

In the foregoing network architecture, the network device provides a communication service for a terminal device. The network device may be a base station on a network side, or other devices that can provide base station functions. In a wireless network, a base station is also referred to as a radio access network (AN) device, and is a device that connects the terminal to the wireless network. In the foregoing architecture, the base station may be an evolved NodeB (eNB or eNodeB), a relay station, or an access point in a Long Term Evolution (LTE) network, or a base station or the like in a 5G network. The terminal is a device that performs uplink and downlink data interactions with the network device from a user's side. For example, the terminal may be a mobile phone or a tablet computer. In addition, in a device-to-device (D2D) communication, the network device may also be a terminal that undertakes a base station function. There is no limit herein.

Figure 2:
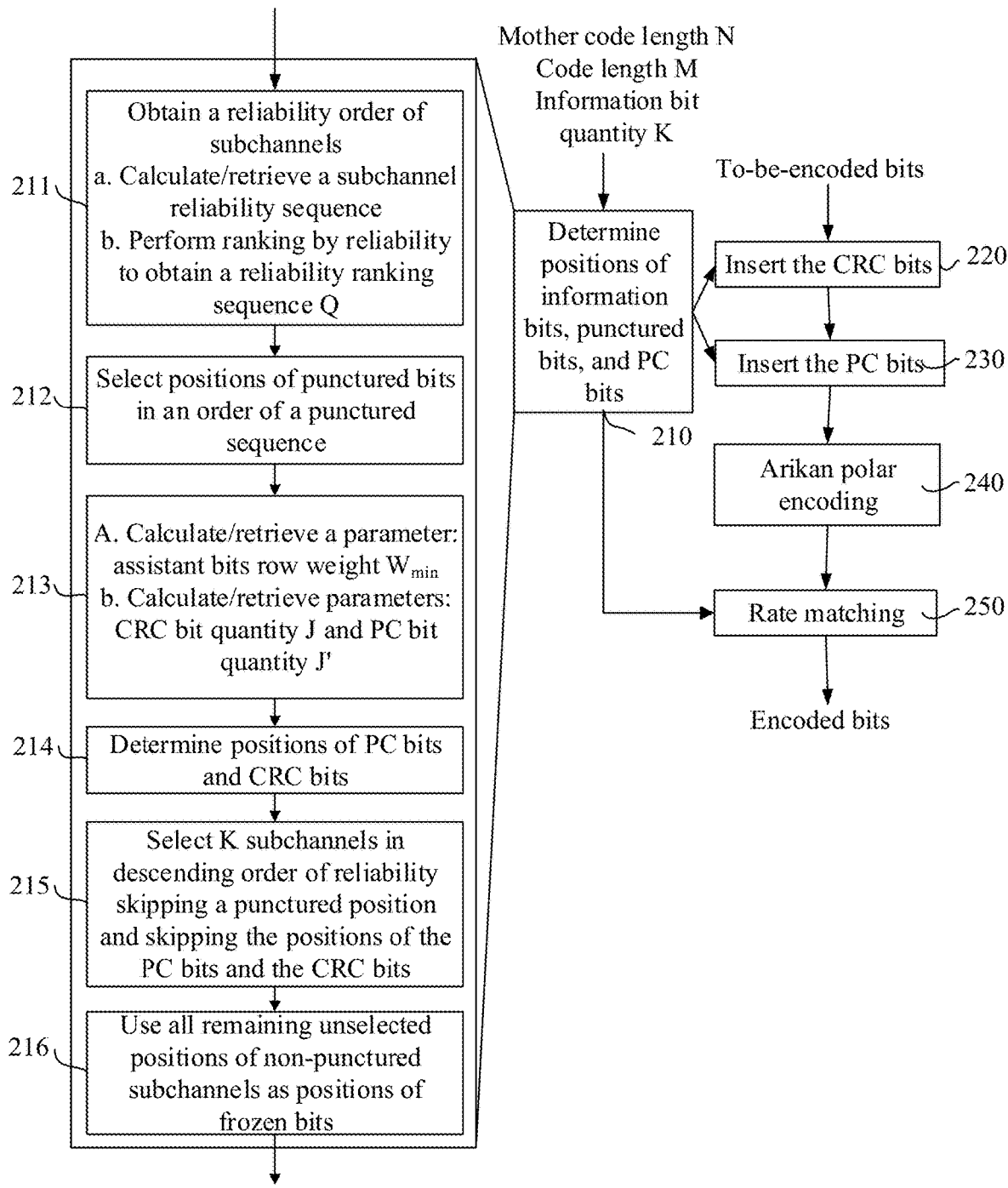
FIG. 2 is a flowchart of a data encoding method according to an embodiment of this application.

FIG. 2 is a flowchart of an encoding method according to an embodiment of this application. Based on the schematic network diagram shown in FIG. 1, both a network device and a terminal may be used as a sending device for the method shown in FIG. 2. The method specifically includes the following steps.

210. Determine positions of information bits, punctured bits, CRC bits, and PC bits in a to-be-encoded sequence based on a mother code length N, a code length M, and an information bit quantity K, where N is an integral power of 2, and M and K are positive integers. Generally, a CRC bit is an example of a first-type auxiliary bit, and a PC bit is an example of the second-type auxiliary bit herein.

It should be noted that in some cases, the sending device may determine the positions of these bits based on N, M, and a code rate R, where R meets R=K/M.

Step 210 may be further divided into the following substeps:

211. Obtain a reliability order of N subchannels corresponding to N bits in a binary row vector $u_1^N$ (also referred to as the to-be-encoded sequence). This is done by: (a) Calculate or retrieve reliabilities of the subchannels; and (b) rank the subchannels by reliability to obtain a reliability ranking sequence Q, where Q is a subchannel number sequence obtained by ranking the reliability in ascending order. Certainly, Q may alternatively be a subchannel number sequence obtained by ranking the reliability in descending order. Generally, ranking in ascending order is used as an example for description in this application.

212. When N>M, N−M bits in the to-be-encoded sequence are punctured. Subchannels corresponding to N−M punctured bits are selected as punctured subchannels. This step is performed only when N>M. When N=M, this step may be skipped.

213. (a) Calculate or retrieve a parameter $W_{min}$. In this embodiment, $W_{min}$ is a minimum row weight of rows in the polar generator matrix $G_N$ that correspond to K' bits (including information bits, CRC bits, and PC bits) in the to-be-encoded sequence, and K'=K+J+J'; and (b) determine a quantity J of CRC bits and a quantity J' of PC bits by calculation or retrieving.

214. Determine positions of the PC bits and the CRC bits in the to-be-encoded sequence.

215. Select K subchannels in descending order of reliability to transmit information bits, where in the to-be-encoded sequence, the K information bits are placed at the positions corresponding to the selected K subchannels, the positions of the punctured bits, the PC bits, and the CRC bits are skipped.

216. Use all remaining unselected positions in the to-be-encoded sequence that correspond to non-punctured subchannels as positions of frozen bits.

It should be noted that step 215 and step 216 may be interchanged. In other words, the positions of the frozen bits may be first selected, that is, N−K' subchannels are selected in ascending order of reliability as subchannels of the frozen bits and the punctured bits, where the positions of the information bits, the PC bits, and the CRC bits are skipped. Then, remaining positions of non-punctured subchannels are used as the positions of the information bits, the PC bits, and the CRC bits.

220. Perform CRC encoding on to-be-encoded information bits to obtain CRC bits, and insert the obtained CRC bits into the positions selected for the CRC bits.

230. Calculate a value of the second-type auxiliary bits (for example, the PC bits) and insert the PC bits into the selected positions, to obtain the to-be-encoded sequence.

240. Perform Arikan polar encoding on the to-be-encoded sequence, to obtain an encoded sequence (i.e. the binary row vector $x_1^N$).

250. Perform rate matching based on the selected positions of the punctured bits, to obtain a rate-matched encoded sequence. The rate-matched encoded sequence has a code length M. It should be noted that the rate matching manners of puncturing and shortening are not distinguished in this application, because a difference between the two is not related to the content of this application. For ease of description, the punctured bits are uniformly used.

Figure 3:
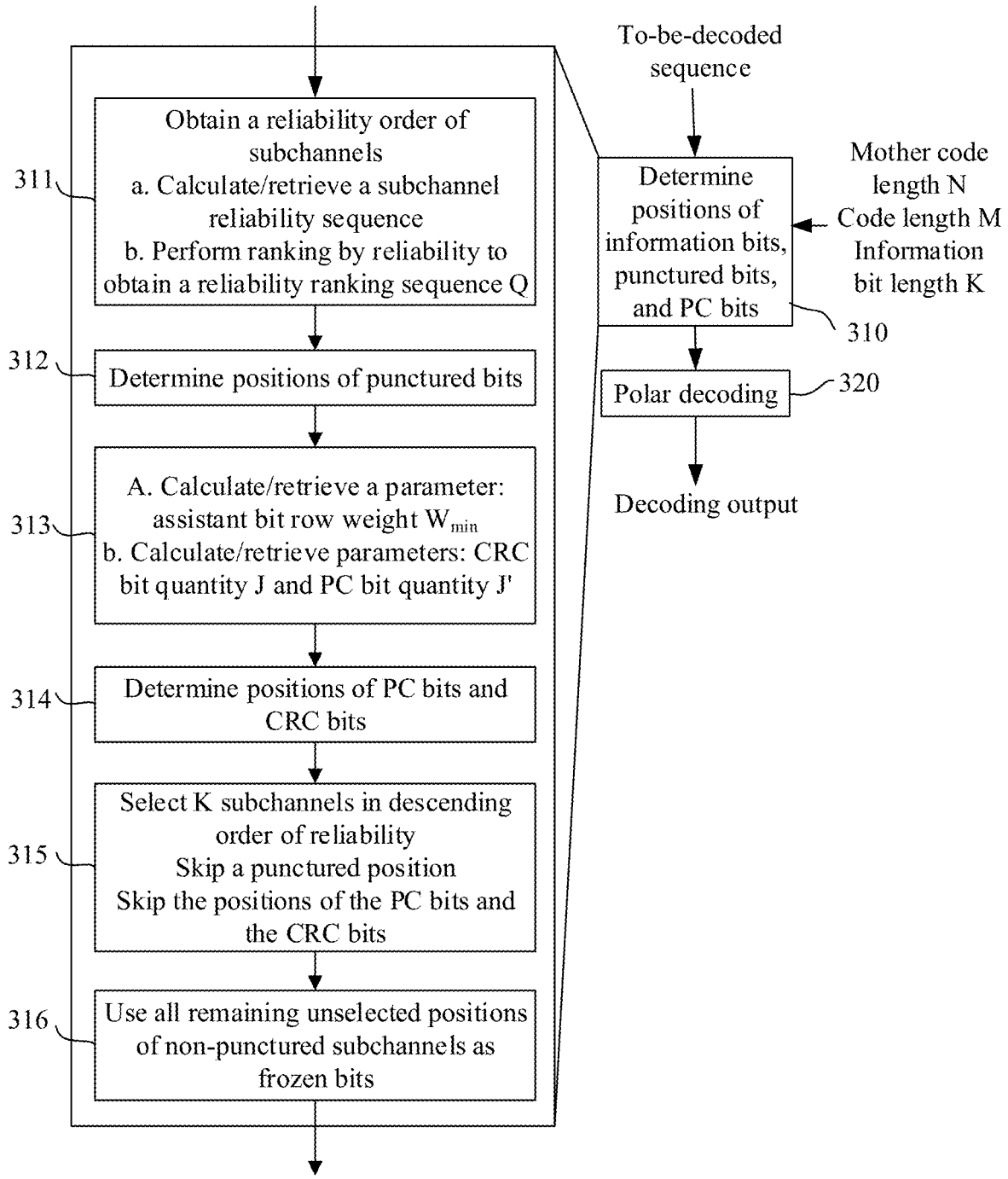
FIG. 3 is a flowchart of a data decoding method according to an embodiment of this application.

Corresponding to the encoding method of FIG. 2, FIG. 3 is a flowchart of a polar decoding method according to an embodiments of this application. Based on the application scenario shown in FIG. 1, both the network device and the terminal may be used as a receiving device for performing the method as shown in FIG. 3. The method specifically includes the following steps.

310. Determine positions of information bits, punctured bits, CRC bits, and PC bits in a to-be-decoded sequence, wherein the to-be-decoded sequence is obtained by rate-dematching a rate-matched encoded sequence based on a mother code length N, a code length M, and an information bit quantity K, where N is an integral power of 2, and M and K are positive integers. Likewise, generally, a CRC bit is an example of a first-type auxiliary bit, and a PC bit is an example of a second-type auxiliary bit herein.

It should be noted that in some cases, the receiving device may determine the positions of these bits based on N, M, and a code rate R, where R meets R=K/M.

Step 310 may be further divided into the following substeps:

311. Obtain a reliability order of N subchannels: (a) Calculate or retrieve a list of subchannel reliabilities; and (b) obtain a reliability ranking sequence Q, where Q is a subchannel number sequence obtained by ranking the reliability in ascending order. Certainly, Q may alternatively be a subchannel number sequence obtained by ranking the reliability in descending order. Generally, ranking in ascending order is used as an example for description in this application.

312. Select subchannels corresponding to N−M punctured bits as punctured subchannels. This step is performed only when N>M. When N=M, this step may be skipped. Similar to that at a transmit end, puncturing and shortening are not distinguished herein, and the punctured bits are used for description.

313. (a) Calculate or retrieve a parameter $W_{min}$, where, in an embodiment, $W_{min}$ is a minimum row weight of rows in the polar generator matrix H that correspond to K' bits (including information bits, CRC bits, and PC bits, and K'=K+J+J') in the to-be-encoded sequence; and (b) determine a quantity J of CRC bits and a quantity J' of PC bits by calculation or retrieving.

314. Determine positions of the PC bits and the CRC bits in the to-be-decoded sequence.

315. Select K subchannels in descending order of reliability, and to receive the information bits in the positions corresponding to the K subchannels, where the positions of the punctured bit, the PC bit, and the CRC bit are skipped.

316. Determine that all remaining unselected positions corresponding to the non-punctured subchannels are positions of frozen bits.

Similar to the transmit end, step 315 and step 316 may be interchanged. In other words, the positions of the frozen bits are first determined, that is, N−K' subchannels are selected in ascending order of reliability as subchannels of the frozen bits, where the positions of the punctured bits, the PC bits, and the CRC bits are skipped. Remaining positions of non-punctured subchannels are determined as the positions of the information bits.

320. Perform Arikan polar decoding on the to-be-decoded sequence, and output a decoded sequence.

In step 213 and step 313, the quantity J of the CRC bits is usually preset. For example, J is usually 16 or 24. Certainly, J may also be dynamically specified. The quantity J' of PC bits (or second-type auxiliary bits) may be preconfigured, or may be calculated by using one of the following formulas, where integer( ) represents a round-up operation, a round-down operation, or a round-off operation, and C is a constant integer, for example, C=0, 1, −1, 2, or −2:

$J'=\text{integer}(\log_2(N-K)+C)$, or $J'=\text{integer}(\log_2(N-K-J)+C)$, or $J'=\text{integer}(\log_2(\min(N-K,K))+C)$, or $J'=\text{integer}(\log_2(\min(N-K-J,K))+C)$, or $J'=\text{integer}(\log_2(M-K)+C)$, or $J'=\text{integer}(\log_2(M-K-J)+C)$, or $J'=\text{integer}(\log_2(\min(M-K,K))+C)$, or $J'=\text{integer}(\log_2(\min(M-K-J,K))+C)$.

Generally, the CRC bits are usually placed together with the information bits, and occupy subchannels with high reliabilities. Therefore, in step 214 and step 314, only the positions of the second-type auxiliary bits may be determined, and K+J subchannels are selected in step 215 and step 315.

In steps 213, 214, 313, and 314, the following methods are used to obtain $W_{min}$ and select positions of the J' second-type auxiliary bits (for example, PC bits).

Method 1: Subchannels of the J' second-type auxiliary bits are first J' subchannels that are not punctured subchannels and that are ranked in descending order of subchannel numbers in K' subchannels. Alternatively, the subchannels of the J' second-type auxiliary bits are first J' subchannels that are not punctured subchannels and that are ranked in descending order of reliabilities in K' subchannels. In this manner, $W_{min}$ does not need to be known. Therefore, optionally, (a) in step 213 and 313 may be omitted.

Method 2: Subchannels of the J' second-type auxiliary bits are determined based on N, K', and a prestored table. Based on N and K', a list of possible subchannel numbers corresponding to the second-type auxiliary bits can be found in the prestored table, and J' subchannel numbers that are not of punctured subchannels are sequentially selected in a left-to-right order. Certainly, the left-to-right order herein is related to a storage format in the table. To be specific, subchannel numbers are ranked in descending order of reliability or in descending order of the subchannel numbers. If subchannel numbers are ranked in ascending order, the J' subchannel numbers need to be selected in a right-to-left order. However, this does not affect the essence of the present embodiments because subchannels that can be finally selected are certainly consistent in the two orders. This is similar in the following other tables, and details are not described again.

Table 1 and Table 2 show examples of possible second-type auxiliary bit subchannel numbers in various mother code lengths less than or equal to 1024. Table 1 is a correspondence table of N, K', and possible second-type auxiliary bit subchannel numbers ranked in descending order of the subchannel numbers, and Table 2 is a correspondence table of N, K', and possible second-type auxiliary bit subchannel numbers ranked in descending order of subchannel reliability. In the example of Table 1, if K'=20 and N=32, possible second-type auxiliary bit subchannel numbers are successively [24, 20, 18, 17, 12, 10, 9, 6, 5, 3]. If J'=3, and a subchannel 24 is a subchannel corresponding to a punctured bit, [20, 18, 17] are the selected J' subchannel numbers used to transmit the second-type auxiliary bits.

Method 3: It can be learned from a $W_{min}$ distribution rule that when the mother code length N is given, $W_{min}$ gradually decreases as K' increases. Because $W_{min}$ is merely an integral power of 2, for a polar code of the mother code length N, $W_{min}$ is decreased only $\log_2^N$ times, and only positions of K' corresponding to $\log_2^N$ transition points need to be prestored. Therefore, a row weight transition point $K_t$ corresponding to K' and an index t of the row weight transition point may be determined based on N, K', and a prestored table, where $K_t \leq K' < K_{t-1}$, and if $K' \geq K_1$, t=1. The row weight transition point $K_t$ herein may be defined as follows: A row weight of a $K_t^{th}$ subchannel ranked in descending order in a sequence Q is ½ of a minimum row weight of $K_{t-1}$ subchannels ranked in descending order in the sequence Q. $W_{min}$ corresponding to K' is calculated based on the obtained t: $W_{min}=2^{t+D}$, where D is a constant, for example, D=0, 0.5, or 1, and t=1, 2, . . . , or T.

For example, Table 3 shows row weight transition point distribution in different mother code lengths less than or equal to 1024. K'=20 and N=32 are still used as an example. If D=0, a transition point number t=2. $W_{min}$ may be obtained by using the following formula: $W_{min}=2^t=4$. Then first J' subchannels that are not punctured subchannels and that are ranked in descending order of subchannel numbers or first J' subchannels that are not punctured subchannels and that are ranked in descending order of reliability are selected from subchannels with a row weight 4 in the K' subchannels to transmit the J' second-type auxiliary bits.

Method 4: Further, $W_{min}$ is directly selected through table lookup based on the method 3. The row weight transition point $K_t$ corresponding to K' and the corresponding $W_{min}$ are determined based on N, K' and the prestored table. For example, Table 4 shows row weight transition point distribution and corresponding $W_{min}$ in different mother code lengths less than or equal to 1024. Still in the example of K'=20 and N=32, $W_{min}$=4, so that an online calculation step can be skipped, and a real-time calculation amount can be further reduced. Then first J' subchannels that are not punctured subchannels and that are ranked in descending order of subchannel numbers or first J' subchannels that are not punctured subchannels and that are ranked in descending order of reliability are selected from subchannels with a row weight $W_{min}$ in the K' subchannels to transmit the J' second-type auxiliary bits.

Method 5: It can be learned by searching for a $W_{min}$ distribution rule that storage burden can be further reduced. Actually, only a correspondence table between $W_{min}$ and a possible second-type auxiliary bit position number in a maximum mother code length needs to be stored, and then a second-type auxiliary bit position is selected according to a preset rule. For example, $W_{min}$ corresponding to K' is first obtained through real-time calculation or table lookup by using one of the foregoing methods. Then, a sequence corresponding to a row weight $W_{min}$ in prestored position number sequences of a mother code length $N_{max}$ that are corresponding to different row weights is divided by $N_{max}$/N, an integer quotient is reserved, and J' position numbers that are not of punctured subchannels are sequentially selected from the reserved integer quotient in a left-to-right order. Subchannels corresponding to the J' position numbers are used to transmit the J' second-type auxiliary bits. It should be noted that a position number meeting this rule is a reverse order of a subchannel number. Therefore, after a position number X is obtained, a subchannel number of a second-type auxiliary bit needs to be obtained based on N–X.

For example, Table 5 shows a correspondence, in the case of $N_{max}$=512, between $W_{min}$ and possible second-type auxiliary bit position numbers ranked in descending order of subchannel numbers. K'=242 and N=256 are used as an example, and $W_{min}$=2 may be obtained by searching Table 4. A position number sequence corresponding to $W_{min}$=2 in Table 5 is [256, 384, 448, 480, 496, 504, 508, 510, 511], and each element in this sequence is divided by $N_{max}$/N=512/256=2, so that [128, 192, 224, 240, 248, 252, 254, 255, 255.5] can be obtained. A non-integer quotient is removed and an integer quotient is reserved. In this case, obtained corresponding position numbers are [128, 192, 224, 240, 248, 252, 254, 255], and a corresponding subchannel number sequence is [128, 64, 32, 16, 8, 4, 2, 1]. It can be learned that this result is completely consistent with Table 1. Therefore, storage space can be more effectively saved in this manner. If J'=3 and a position number 192 herein is a punctured subchannel, second-type auxiliary bit position numbers are X=[128, 224, 240], and subchannel numbers of the J' second-type auxiliary bits are N–X=[128, 32, 16].

Method 6: This method is similar to the principle of Method 5, but a manner of selecting a position number from a position number sequence corresponding to $N_{max}$ is slightly different. After $W_{min}$ is determined, position numbers less than or equal to N are reserved for a sequence corresponding to a row weight $W_{min} \times N_{max}$/N in prestored position number sequences of a mother code length $N_{max}$ that are corresponding to different row weights, and J' position numbers that are not of punctured subchannels are sequentially selected from the reserved position numbers less than or equal to N in a left-to-right order. Subchannels corresponding to the J' position numbers are used to transmit the J' second-type auxiliary bits.

In the example of Method 5, K'=242, N=256, and corresponding $W_{min}$=2. Table 5 is searched for a position number sequence with $W_{min}$=2×$N_{max}$/N=2×2=4, and the position number sequence is [128, 192, 224, 240, 248, 252, 254, 255, 320, 352, 368, 376, 380, 382, 383, 416, 432, 440, 444, 446, 447, 464, 472, 476, 478, 479, 488, 492, 494, 495, 500, 502, 503, 506, 507, 509]. Position numbers greater than N=256 are removed, and [128, 192, 224, 240, 248, 252 254, 255] can be obtained, and therefore a corresponding subchannel number sequence is [128, 64, 32, 16, 8, 4, 2, 1]. It can be learned that this result is completely consistent with Method 5 and Table 1. Therefore, storage space can also be more effectively saved in this manner.

Similarly, Table 6 shows a correspondence, in the case of $N_{max}$=512, between $W_{min}$ and possible second-type auxiliary bit position numbers ranked in descending order of reliability. Table 7 shows a correspondence, in the case of $N_{max}$=1024, between $W_{min}$ and possible second-type auxiliary bit position numbers ranked in descending order of subchannel numbers. Table 8 shows a correspondence, in the case of $N_{max}$=1024, between $W_{min}$ and possible second-type auxiliary bit position numbers ranked in descending order of reliability. These tables are also applicable to Method 5 and Method 6.

Method 7: Based on Method 5 and Method 6, it can be learned that $W_{min}$ plays only a bridge function. In an actual system, position numbers of the J' second-type auxiliary bits can be obtained without a need to calculate or determine $W_{min}$. Details are as follows:

Only a correspondence table between a possible second-type auxiliary bit position number in a maximum mother code length and a transition point index number needs to be stored in the system, and then the position numbers of the J' second-type auxiliary bits are selected according to a preset rule. For example, a transition point index number t corresponding to K' is first obtained through real-time calculation or table lookup by using one of the foregoing methods. Then, a sequence corresponding to the index number t in prestored position number sequences of a mother code length $N_{max}$ that are corresponding to different row weights is divided by $N_{max}$/N, an integer quotient is reserved, and J' position numbers that are not of punctured subchannels are sequentially selected from the reserved integer quotient in a left-to-right order. Subchannels corresponding to the J' position numbers are used to transmit the J' second-type auxiliary bits. It should be noted that a position number meeting this rule is a reverse order of a subchannel number. Therefore, after a position number X is obtained, a subchannel number of a second-type auxiliary bit needs to be obtained based on N–X.

For example, Table 9 shows a correspondence, in the case of $N_{max}$=512, between an index number and possible second-type auxiliary bit position numbers ranked in descending order of subchannel numbers. K'=242 and N=256 are still used as an example, and the index number t=1 may be obtained by searching Table 3. A position number sequence corresponding to t=1 in Table 9 is [256, 384, 448, 480, 496, 504, 508, 510, 511], and each element in this sequence is divided by $N_{max}$/N=512/256=2, so that [128, 192, 224, 240, 248, 252, 254, 255, 255.5] can be obtained. A non-integer quotient is removed and an integer quotient is reserved. In this case, obtained corresponding position numbers are [128, 192, 224, 240, 248, 252, 254, 255], and a corresponding subchannel number sequence is [128, 64, 32, 16, 8, 4, 2, 1].

It can be learned that this result is completely consistent with Method 5, Method 6, and Table 1.

Similarly, Table 10 shows a correspondence, in the case of $N_{max}=512$, between an index number and possible second-type auxiliary bit position numbers ranked in descending order of reliability. Table 11 shows a correspondence, in the case of $N_{max}=1024$, between an index number and possible second-type auxiliary bit position numbers ranked in descending order of subchannel numbers. Table 12 shows a correspondence, in the case of $N_{max}=1024$, between an index number and possible second-type auxiliary bit position numbers ranked in descending order of reliability. These tables are also applicable to Method 5 and Method 6.

It should be noted that the "value range of K'" shown in Table 5 to Table 12 is only applicable to $N_{max}$. A relationship between another mother code length and K', $W_{min}$, or a transition point index number is subject to Table 3 or Table 4.

Actually, it can also be learned that a value of a transition point index number in Table 3 and Table 4 is exactly equal to a minimum Hamming distance corresponding to the K' subchannels. This is because the table is made in a manner of determining K' in ascending order of $W_{min}$, ensuring that K' in a same column corresponds to same $W_{min}$, and $t=\log_2 W_{min}$ is exactly met.

In addition, different mother code lengths shown in Table 1 to Table 12 are merely examples, and other mother code lengths or other ranking manners may also be made into such a table in a similar manner. In actual application, only some content in the table may be used.

Figure 4:
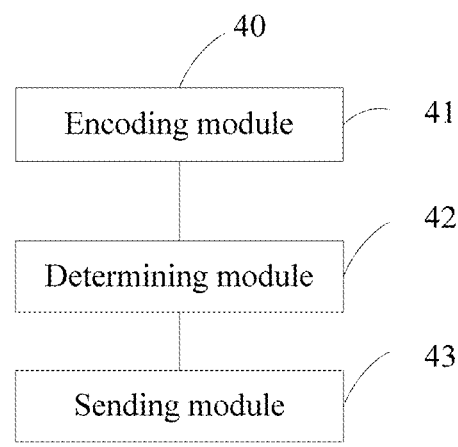
FIG. 4 is a block diagram of an encoding apparatus according to an embodiment of this application.

FIG. 4 is a schematic diagram of a polar code encoding apparatus 40 according to this application. The apparatus 40 includes an encoding module 41, a determining module 42, and a sending module 43.

The encoding module 41 is configured to perform polar encoding on a to-be-encoded sequence, where a mother code length of a polar code is N, a sequence length obtained after encoding is M, and the to-be-encoded sequence includes frozen bits, first-type auxiliary bits, second-type auxiliary bits, punctured bits, and information bits.

The determining module 42 is configured to determine subchannels corresponding to the frozen bits, the first-type auxiliary bits, the second-type auxiliary bits, the punctured bits, and the information bits. A method for selecting the second-type auxiliary bits includes but is not limited to the seven methods described in step 213 and step 214 in the foregoing embodiment. The determining module 42 is further configured to determine values of the first-type auxiliary bits and the second-type auxiliary bits.

The sending module 43 is configured to send an encoded sequence.

A mother code length used in an encoding process is N, a code rate is R, a code length obtained after encoding is M, a quantity of information bits is K, a quantity of first-type auxiliary bits is J, a quantity of second-type auxiliary bits is J', and K+J+J'=K'.

When N=M, there is no punctured bit, and an operation of determining subchannels of the punctured bits does not need to be performed.

When the quantity J' of second-type auxiliary bits is not preset, the determining module 43 is further configured to calculate a value of J'. A specific method includes but is not limited to the method in step 213 in the foregoing embodiment.

It should be noted that a rate matching module and the like are not shown in the figure, and details are not described because a specific rate matching manner is not related to this application.

Figure 5:
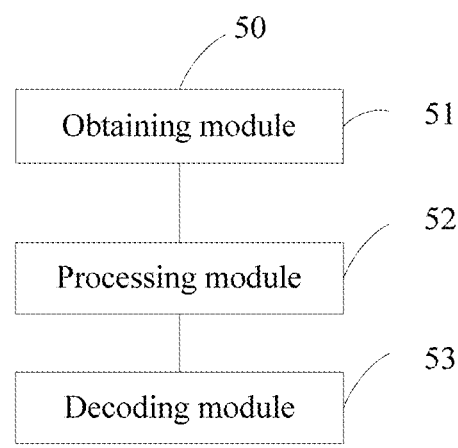
FIG. 5 is a block diagram of a receiving apparatus according to an embodiment of this application.

FIG. 5 is a block diagram of a polar code decoding apparatus 50 according to this application. The apparatus 50 includes an obtaining module 51, a determining module 52, and a decoding module 53.

The obtaining module 51 is configured to obtain a to-be-decoded sequence.

The determining module 52 is configured to determine subchannels corresponding to frozen bits, first-type auxiliary bits, second-type auxiliary bits, punctured bits, and information bits. A method for selecting the second-type auxiliary bits includes but is not limited to the seven methods described in step 313 and step 314 in the foregoing embodiment.

The decoding module 53 is configured to perform polar decoding on the received to-be-decoded sequence to obtain a decoded sequence, where a mother code length of a polar code is N.

A mother code length used in a decoding process is N, a code rate is R, a code length obtained after encoding is M, a quantity of information bits is K, a quantity of first-type auxiliary bits is J, a quantity of second-type auxiliary bits is J', and K+J+J'=K'.

When the quantity J' of second-type auxiliary bits is not preset, the determining module 52 is further configured to calculate a value of J'. A specific method includes but is not limited to the method in step 313 in the foregoing embodiment.

Figure 6:
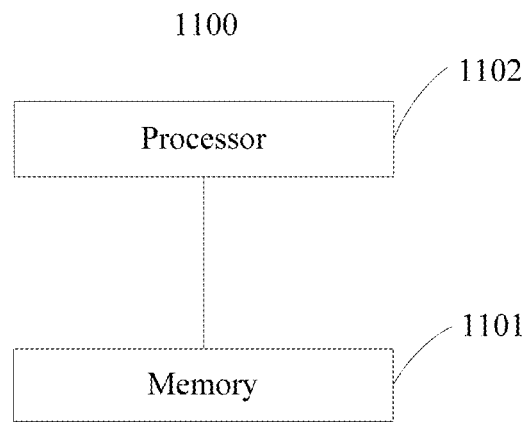
FIG. 6 is a simplified structural diagram of an encoding entity apparatus according to an embodiment of this application.

FIG. 6 is a simplified block diagram of an encoding entity apparatus 1100 according to this application. The apparatus 1100 includes a memory 1101 and a processor 1102.

The memory 1101 is configured to store an execution instruction. The memory may be a flash (flash memory).

The processor 1102 is configured to execute the execution instruction stored in the memory, to implement steps of the encoding method shown in FIG. 2. For details, refer to related descriptions in the foregoing method embodiment.

Optionally, the memory 1101 may be independent or may be integrated with the processor 1102.

When the processor 1102 is implemented by hardware, for example, a logic circuit or an integrated circuit, the processor 1102 is connected to other hardware by using an interface, and the memory may not be required in this case.

When the memory 1101 is a component independent of the processor 1102, the apparatus 1100 may further include a bus 1103, configured to connect the memory and the processor.

The encoding apparatus in FIG. 6 may further include a transmitter (not shown in the figure), configured to send a sequence encoded by the processor 1102 through polar encoding.

In the foregoing sending device, there is at least one processor, and the at least one processor is configured to execute a computer-executable instruction stored in the memory, so that the sending device exchanges data with a receiving device by using a communications interface, to perform the sending method provided in the foregoing various implementations.

Figure 7:
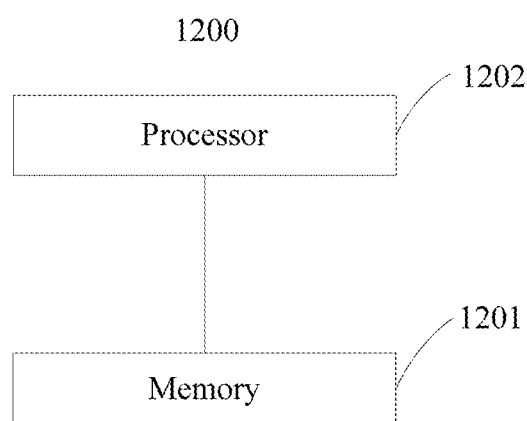
FIG. 7 is a simplified structural diagram of a decoding entity apparatus according to an embodiment this application.

FIG. 7 is a simplified block diagram of a decoding entity apparatus 1200 according to this application. The apparatus 1200 includes a memory 1201 and a processor 1202.

The memory 1201 is configured to store an execution instruction. The memory may be a flash memory.

The processor 1202 is configured to execute the execution instruction stored in the memory, to implement steps of the decoding method shown in FIG. 3. For details, refer to related descriptions in the foregoing method embodiment.

Optionally, the memory 1201 may be independent or may be integrated with the processor 1202.

When the processor 1202 is implemented by hardware, for example, a logic circuit or an integrated circuit, the processor 1202 is connected to other hardware by using an interface, and the memory may not be required in this case.

The decoding apparatus in FIG. 7 may further include a receiver (not shown in the figure), configured to: receive a to-be-decoded signal, and send the to-be-decoded signal to the processor 1202.

In the foregoing receiving device, there is at least one processor, and the at least one processor is configured to execute a computer-executable instruction stored in the memory, so that the receiving device exchanges data with a sending device by using a communications interface, to perform the receiving method provided in the foregoing various implementations.

This application further provides a computer readable storage medium. The computer readable storage medium stores a computer-executable instruction, and when at least one processor of a sending device executes the computer-executable instruction, the sending device executes the data encoding method provided in the foregoing various implementations.

This application further provides a computer readable storage medium. The computer readable storage medium stores a computer-executable instruction, and when at least one processor of a receiving device executes the computer-executable instruction, the receiving device executes the data decoding method provided in the foregoing various implementations.

This application further provides a computer program product. The computer program product includes a computer-executable instruction, and the computer-executable instruction is stored in a computer readable storage medium. At least one processor of a sending device may read the computer-executable instruction from the computer readable storage medium, and the at least one processor executes the computer-executable instruction, so that the sending device implements the data encoding method provided in the foregoing various implementations.

This application further provides a computer program product. The computer program product includes a computer-executable instruction, and the computer-executable instruction is stored in a computer readable storage medium. At least one processor of a receiving device may read the computer-executable instruction from the computer readable storage medium, and the at least one processor executes the computer-executable instruction, so that the receiving device implements the data decoding method provided in the foregoing various implementations.

In the embodiment of the sending device or the receiving device, it should be understood that the processor may be a central processing unit (CPU), or may be another general purpose processor, a digital signal processor (DSP), an application-specific integrated circuit (ASIC), or the like. The general purpose processor may be a microprocessor or the processor may be any normal processor, or the like. The steps of the method disclosed with reference to this application may be directly performed by a hardware processor, or may be performed by using a combination of hardware in the processor and a software module.

All or some steps of the foregoing method embodiment may be implemented by using a program instructing relevant hardware. The program may be stored in a computer readable memory. When the program is executed, the steps of the foregoing method embodiment are performed. The foregoing memory (storage medium) includes: a read-only memory (ROM), a random access memory (RAM), a flash memory, a hard disk, a solid-state drive, a magnetic tape, a floppy disk, an optical disc, and any combination thereof.

Finally, it should be noted that, although the solutions are described in detail with reference to the foregoing embodiments, modifications to the technical solutions described in the foregoing embodiments or equivalent replacements may still be made to some or all technical features thereof, without departing from the scope of the technical solutions of the embodiments of this application.

The tables described in the foregoing embodiments are as follows:

Table 1: Correspondence table of N, K', and possible second-type auxiliary bit subchannel numbers ranked in descending order of subchannel numbers Table 2: Correspondence table of N, K', and possible second-type auxiliary bit subchannel numbers ranked in descending order of subchannel reliability Table 3: Row weight transition point distribution in different mother code lengths Table 4: Row weight transition point distribution and $W_{min}$ distribution in different mother code lengths Table 5: Correspondence, in the case of $N_{max}=512$, between $W_{min}$ and possible second-type auxiliary bit position numbers ranked in descending order of subchannel numbers Table 6: Correspondence, in the case of $N_{max}=512$, between $W_{min}$ and possible second-type auxiliary bit position numbers ranked in descending order of reliability Table 7: Correspondence, in the case of $N_{max}=1024$, between $W_{min}$ and possible second-type auxiliary bit position numbers ranked in descending order of subchannel numbers Table 8: Correspondence, in the case of $N_{max}=1024$, between $W_{min}$ and possible second-type auxiliary bit position numbers ranked in descending order of reliability Table 9: Correspondence, in the case of $N_{max}=512$, between an index and possible second-type auxiliary bit position numbers ranked in descending order of subchannel numbers Table 10: Correspondence, in the case of $N_{max}=512$, between an index and possible second-type auxiliary bit position numbers ranked in descending order of reliability Table 11: Correspondence, in the case of $N_{max}=1024$, between an index and possible second-type auxiliary bit position numbers ranked in descending order of subchannel numbers Table 12: Correspondence, in the case of $N_{max}=1024$, between an index and possible second-type auxiliary bit position numbers ranked in descending order of reliability The tables are successively as follows:

TABLE 1

Correspondence table of N, K', and possible second-type auxiliary bit subchannel numbers ranked in descending order of subchannel numbers

|   | Value range of K' | Possible second-type auxiliary bit subchannel numbers |
|---|---|---|
| N = 4 | 2 ≤ K' < 4 | 2, 1 |
| N = 8 | 5 ≤ K' < 8 | 4, 2, 1 |
|   | 2 ≤ K' < 5 | 6, 5, 3 |

TABLE 1-continued

Correspondence table of N, K', and possible second-type auxiliary bit subchannel numbers ranked in descending order of subchannel numbers

| | Value range of K' | Possible second-type auxiliary bit subchannel numbers |
|---|---|---|
| N = 16 | 12 ≤ K' < 16 | 8, 4, 2, 1 |
| | 6 ≤ K' < 12 | 12, 10, 9, 6, 5, 3 |
| | 2 ≤ K' < 6 | 14, 13, 11, 7 |
| N = 32 | 27 ≤ K' < 32 | 16, 8, 4, 2, 1 |
| | 16 ≤ K' < 27 | 24, 20, 18, 17, 12, 10, 9, 6, 5, 3 |
| | 7 ≤ K' < 16 | 28, 26, 25, 22, 21, 19, 14, 13, 11, 7 |
| | 2 ≤ K' < 7 | 30, 29, 27, 23, 15 |
| N = 64 | 57 ≤ K' < 64 | 32, 16, 8, 4, 2, 1 |
| | 38 ≤ K' < 57 | 48, 40, 36, 34, 33, 24, 20, 18, 17, 12, 10, 9, 6, 5, 3 |
| | 19 ≤ K' < 38 | 56, 52, 50, 49, 44, 42, 41, 38, 37, 35, 28, 26, 25, 22, 21, 19, 14, 13, 11, 7 |
| | 7 ≤ K' < 19 | 60, 58, 57, 54, 53, 51, 46, 45, 43, 39, 30, 29, 27, 23, 15 |
| | 2 ≤ K' < 7 | 62, 61, 59, 55, 47, 31 |
| N = 128 | 117 ≤ K' < 128 | 64, 32, 16, 8, 4, 2, 1 |
| | 85 ≤ K' < 117 | 96, 80, 72, 68, 66, 65, 48, 40, 36, 34, 33, 24, 20, 18, 17, 12, 10, 9, 6, 5, 3 |
| | 47 ≤ K' < 85 | 112, 104, 100, 98, 97, 88, 84, 82, 81, 76, 74, 73, 70, 69, 67, 56, 52, 50, 49, 44, 42, 41, 38, 37, 35, 28, 26, 25, 22, 21, 19, 14, 13, 11, 7 |
| | 20 ≤ K' < 47 | 120, 116, 114, 113, 108, 106, 105, 102, 101, 99, 92, 90, 89, 86, 85, 83, 78, 77, 75, 71, 60, 58, 57, 54, 53, 51, 46, 45, 43, 39, 30, 29, 27, 23, 15 |
| | 7 ≤ K' < 20 | 124, 122, 121, 118, 117, 115, 110, 109, 107, 103, 94, 93, 91, 87, 79, 62, 61, 59, 55, 47, 31 |
| | 2 ≤ K' < 7 | 126, 125, 123, 119, 111, 95, 63 |
| N = 256 | 240 ≤ K' < 256 | 128, 64, 32, 16, 8, 4, 2, 1 |
| | 183 ≤ K' < 240 | 192, 160, 144, 136, 132, 130, 129, 96, 80, 72, 68, 66, 65, 48, 40, 36, 34, 33, 24, 20, 18, 17, 12, 10, 9, 6, 5, 3 |
| | 109 ≤ K' < 183 | 224, 208, 200, 196, 194, 193, 176, 168, 164, 162, 161, 152, 148, 146, 145, 140, 138, 137, 134, 133, 131, 112, 104, 100, 98, 97, 88, 84, 82, 81, 76, 74, 73, 70, 69, 67, 56, 52, 50, 49, 44, 42, 41, 38, 37, 35, 28, 26, 25, 22, 21, 19, 14, 13, 11, 7 |
| | 52 ≤ K' < 109 | 240, 232, 228, 226, 225, 216, 212, 210, 209, 204, 202, 201, 198, 197, 195, 184, 180, 178, 177, 172, 170, 169, 166, 165, 163, 156, 154, 153, 150, 149, 147, 142, 141, 139, 135, 120, 116, 114, 113, 108, 106, 105, 102, 101, 99, 92, 90, 89, 86, 85, 83, 78, 77, 75, 71, 60, 58, 57, 54, 53, 51, 46, 45, 43, 39, 30, 29, 27, 23, 15 |
| | 21 ≤ K' < 52 | 248, 244, 242, 241, 236, 234, 233, 230, 229, 227, 220, 218, 217, 214, 213, 211, 206, 205, 203, 199, 188, 186, 185, 182, 181, 179, 174, 173, 171, 167, 158, 157, 155, 151, 143, 124, 122, 121, 118, 117, 115, 110, 109, 107, 103, 94, 93, 91, 87, 79, 62, 61, 59, 55, 47, 31 |
| | 7 ≤ K' < 21 | 252, 250, 249, 246, 245, 243, 238, 237, 235, 231, 222, 221, 219, 215, 207, 190, 189, 187, 183, 175, 159, 126, 125, 123, 119, 111, 95, 63 |
| | 2 ≤ K' < 7 | 254, 253, 251, 247, 239, 223, 191, 127 |
| N = 512 | 487 ≤ K' < 512 | 256, 128, 64, 32, 16, 8, 4, 2, 1 |
| | 387 ≤ K' < 487 | 384, 320, 288, 272, 264, 260, 258, 257, 192, 160, 144, 136, 132, 130, 129, 96, 80, 72, 68, 66, 65, 48, 40, 36, 34, 33, 24, 20, 18, 17, 12, 10, 9, 6, 5, 3 |
| | 243 ≤ K' < 387 | 448, 416, 400, 392, 388, 386, 385, 352, 336, 328, 324, 322, 321, 304, 296, 292, 290, 289, 280, 276, 274, 273, 268, 266, 265, 262, 261, 259, 224, 208, 200, 196, 194, 193, 176, 168, 164, 162, 161, 152, 148, 146, 145, 140, 138, 137, 134, 133, 131, 112, 104, 100, 98, 97, 88, 84, 82, 81, 76, 74, 73, 70, 69, 67, 56, 52, 50, 49, 44, 42, 41, 38, 37, 35, 28, 26, 25, 22, 21, 19, 14, 13, 11, 7 |
| | 125 ≤ K' < 243 | 480, 464, 456, 452, 450, 449, 432, 424, 420, 418, 417, 408, 404, 402, 401, 396, 394, 393, 390, 389, 387, 368, 360, 356, 354, 353, 344, 340, 338, 337, 332, 330, 329, 326, 325, 323, 312, 308, 306, 305, 300, 298, 297, 294, 293, 291, 284, 282, 281, 278, 277, 275, 270, 269, 267, 263, 240, 232, 228, 226, 225, 216, 212, 210, 209, 204, 202, 201, 198, 197, 195, 184, 180, 178, 177, 172, 170, 169, 166, 165, 163, 156, 154, 153, 150, 149, 147, 142, 141, 139, 135, 120, 116, 114, 113, 108, 106, 105, 102, 101, 99, 92, 90, 89, 86, 85, 83, 78, 77, 75, 71, 60, 58, 57, 54, 53, 51, 46, 45, 43, 39, 30, 29, 27, 23, 15 |
| | 55 ≤ K' < 125 | 496, 488, 484, 482, 481, 472, 468, 466, 465, 460, 458, 457, 454, 453, 451, 440, 436, 434, 433, 428, 426, 425, 422, 421, 419, 412, 410, 409, 406, 405, 403, 398, 397, 395, 391, 376, 372, 370, 369, 364, 362, 361, 358, 357, 355, 348, 346, 345, 342, 341, 339, 334, 333, 331, 327, 316, 314, 313, 310, 309, 307, 302, 301, 299, 295, 286, 285, 283, 279, 271, 248, 244, 242, 241, 236, 234, 233, 230, 229, 227, 220, 218, 217, 214, 213, 211, 206, 205, 203, 199, 188, 186, 185, 182, 181, 179, 174, 173, 171, 167, 158, 157, 155, 151, |

TABLE 1-continued

Correspondence table of N, K', and possible second-type auxiliary bit
subchannel numbers ranked in descending order of subchannel numbers

| | Value range of K' | Possible second-type auxiliary bit subchannel numbers |
|---|---|---|
| | | 143, 124, 122, 121, 118, 117, 115, 110, 109, 107, 103, 94, 93, 91, 87, 79, 62, 61, 59, 55, 47, 31 |
| | 21 ≤ K' < 55 | 504, 500, 498, 497, 492, 490, 489, 486, 485, 483, 476, 474, 473, 470, 469, 467, 462, 461, 459, 455, 444, 442, 441, 438, 437, 435, 430, 429, 427, 423, 414, 413, 411, 407, 399, 380, 378, 377, 374, 373, 371, 366, 365, 363, 359, 350, 349, 347, 343, 335, 318, 317, 315, 311, 303, 287, 252, 250, 249, 246, 245, 243, 238, 237, 235, 231, 222, 221, 219, 215, 207, 190, 189, 187, 183, 175, 159, 126, 125, 123, 119, 111, 95, 63 |
| | 7 ≤ K' < 21 | 508, 506, 505, 502, 501, 499, 494, 493, 491, 487, 478, 477, 475, 471, 463, 446, 445, 443, 439, 431, 415, 382, 381, 379, 375, 367, 351, 319, 254, 253, 251, 247, 239, 223, 191, 127 |
| | 2 ≤ K' < 7 | 510, 509, 507, 503, 495, 479, 447, 383, 255 |
| N = 1024 | 984 ≤ K' < 1024 | 512, 256, 128, 64, 32, 16, 8, 4, 2, 1 |
| | 805 ≤ K' < 984 | 768, 640, 576, 544, 528, 520, 516, 514, 513, 384, 320, 288, 272, 264, 260, 258, 257, 192, 160, 144, 136, 132, 130, 129, 96, 80, 72, 68, 66, 65, 48, 40, 36, 34, 33, 24, 20, 18, 17, 12, 10, 9, 6, 5, 3 |
| | 531 ≤ K' < 805 | 896, 832, 800, 784, 776, 772, 770, 769, 704, 672, 656, 648, 644, 642, 641, 608, 592, 584, 580, 578, 577, 560, 552, 548, 546, 545, 536, 532, 530, 529, 524, 522, 521, 518, 517, 515, 448, 416, 400, 392, 388, 386, 385, 352, 336, 328, 324, 322, 321, 304, 296, 292, 290, 289, 280, 276, 274, 273, 268, 266, 265, 262, 261, 259, 224, 208, 200, 196, 194, 193, 176, 168, 164, 162, 161, 152, 148, 146, 145, 140, 138, 137, 134, 133, 131, 112, 104, 100, 98, 97, 88, 84, 82, 81, 76, 74, 73, 70, 69, 67, 56, 52, 50, 49, 44, 42, 41, 38, 37, 35, 28, 26, 25, 22, 21, 19, 14, 13, 11, 7 |
| | 287 ≤ K' < 531 | 960, 928, 912, 904, 900, 898, 897, 864, 848, 840, 836, 834, 833, 816, 808, 804, 802, 801, 792, 788, 786, 785, 780, 778, 777, 774, 773, 771, 736, 720, 712, 708, 706, 705, 688, 680, 676, 674, 673, 664, 660, 658, 657, 652, 650, 649, 646, 645, 643, 624, 616, 612, 610, 609, 600, 596, 594, 593, 588, 586, 585, 582, 581, 579, 568, 564, 562, 561, 556, 554, 553, 550, 549, 547, 540, 538, 537, 534, 533, 531, 526, 525, 523, 519, 480, 464, 456, 452, 450, 449, 432, 424, 420, 418, 417, 408, 404, 402, 401, 396, 394, 393, 390, 389, 387, 368, 360, 356, 354, 353, 344, 340, 338, 337, 332, 330, 329, 326, 325, 323, 312, 308, 306, 305, 300, 298, 297, 294, 293, 291, 284, 282, 281, 278, 277, 275, 270, 269, 267, 263, 240, 232, 228, 226, 225, 216, 212, 210, 209, 204, 202, 201, 198, 197, 195, 184, 180, 178, 177, 172, 170, 169, 166, 165, 163, 156, 154, 153, 150, 149, 147, 142, 141, 139, 135, 120, 116, 114, 113, 108, 106, 105, 102, 101, 99, 92, 90, 89, 86, 85, 83, 78, 77, 75, 71, 60, 58, 57, 54, 53, 51, 46, 45, 43, 39, 30, 29, 27, 23, 15 |
| | 134 ≤ K' < 287 | 992, 976, 968, 964, 962, 961, 944, 936, 932, 930, 929, 920, 916, 914, 913, 908, 906, 905, 902, 901, 899, 880, 872, 868, 866, 865, 856, 852, 850, 849, 844, 842, 841, 838, 837, 835, 824, 820, 818, 817, 812, 810, 809, 806, 805, 803, 796, 794, 793, 790, 789, 787, 782, 781, 779, 775, 752, 744, 740, 738, 737, 728, 724, 722, 721, 716, 714, 713, 710, 709, 707, 696, 692, 690, 689, 684, 682, 681, 678, 677, 675, 668, 666, 665, 662, 661, 659, 654, 653, 651, 647, 632, 628, 626, 625, 620, 618, 617, 614, 613, 611, 604, 602, 601, 598, 597, 595, 590, 589, 587, 583, 572, 570, 569, 566, 565, 563, 558, 557, 555, 551, 542, 541, 539, 535, 527, 496, 488, 484, 482, 481, 472, 468, 466, 465, 460, 458, 457, 454, 453, 451, 440, 436, 434, 433, 428, 426, 425, 422, 421, 419, 412, 410, 409, 406, 405, 403, 398, 397, 395, 391, 376, 372, 370, 369, 364, 362, 361, 358, 357, 355, 348, 346, 345, 342, 341, 339, 334, 333, 331, 327, 316, 314, 313, 310, 309, 307, 302, 301, 299, 295, 286, 285, 283, 279, 271, 248, 244, 242, 241, 236, 234, 233, 230, 229, 227, 220, 218, 217, 214, 213, 211, 206, 205, 203, 199, 188, 186, 185, 182, 181, 179, 174, 173, 171, 167, 158, 157, 155, 151, 143, 124, 122, 121, 118, 117, 115, 110, 109, 107, 103, 94, 93, 91, 87, 79, 62, 61, 59, 55, 47, 31 |
| | 56 ≤ K' < 134 | 1008, 1000, 996, 994, 993, 984, 980, 978, 977, 972, 970, 969, 966, 965, 963, 952, 948, 946, 945, 940, 938, 937, 934, 933, 931, 924, 922, 921, 918, 917, 915, 910, 909, 907, 903, 888, 884, 882, 881, 876, 874, 873, 870, 869, 867, 860, 858, 857, 854, 853, 851, 846, 845, 843, 839, 828, 826, 825, 822, 821, 819, 814, 813, 811, 807, 798, 797, 795, 791, 783, 760, 756, 754, 753, 748, 746, 745, 742, 741, 739, 732, 730, 729, 726, 725, 723, 718, 717, 715, 711, 700, 698, 697, 694, 693, 691, 686, 685, 683, 679, 670, 669, 667, 663, 655, 636, 634, 633, 630, 629, 627, 622, 621, 619, 615, 606, 605, 603, 599, 591, 574, 573, 571, 567, 559, 543, 504, 500, 498, 497, 492, 490, 489, 486, 485, 483, 476, 474, 473, 470, 469, 467, 462, 461, 459, 455, 444, 442, 441, 438, 437, 435, 430, 429, 427, |

TABLE 1-continued

Correspondence table of N, K', and possible second-type auxiliary bit subchannel numbers ranked in descending order of subchannel numbers

| Value range of K' | Possible second-type auxiliary bit subchannel numbers |
|---|---|
| | 423, 414, 413, 411, 407, 399, 380, 378, 377, 374, 373, 371, 366, 365, 363, 359, 350, 349, 347, 343, 335, 318, 317, 315, 311, 303, 287, 252, 250, 249, 246, 245, 243, 238, 237, 235, 231, 222, 221, 219, 215, 207, 190, 189, 187, 183, 175, 159, 126, 125, 123, 119, 111, 95, 63 |
| 21 ≤ K' < 56 | 1016, 1012, 1010, 1009, 1004, 1002, 1001, 998, 997, 995, 988, 986, 985, 982, 981, 979, 974, 973, 971, 967, 956, 954, 953, 950, 949, 947, 942, 941, 939, 935, 926, 925, 923, 919, 911, 892, 890, 889, 886, 885, 883, 878, 877, 875, 871, 862, 861, 859, 855, 847, 830, 829, 827, 823, 815, 799, 764, 762, 761, 758, 757, 755, 750, 749, 747, 743, 734, 733, 731, 727, 719, 702, 701, 699, 695, 687, 671, 638, 637, 635, 631, 623, 607, 575, 508, 506, 505, 502, 501, 499, 494, 493, 491, 487, 478, 477, 475, 471, 463, 446, 445, 443, 439, 431, 415, 382, 381, 379, 375, 367, 351, 319, 254, 253, 251, 247, 239, 223, 191, 127 |
| 7 ≤ K' < 21 | 1020, 1018, 1017, 1014, 1013, 1011, 1006, 1005, 1003, 999, 990, 989, 987, 983, 975, 958, 957, 955, 951, 943, 927, 894, 893, 891, 887, 879, 863, 831, 766, 765, 763, 759, 751, 735, 703, 639, 510, 509, 507, 503, 495, 479, 447, 383, 255 |
| 2 ≤ K' < 7 | 1022, 1021, 1019, 1015, 1007, 991, 959, 895, 767, 511 |

TABLE 2

Correspondence table of N, K', and possible second-type auxiliary bit subchannel numbers ranked in descending order of subchannel reliability

| | Value range of K' | Possible second-type auxiliary bit subchannel numbers |
|---|---|---|
| N = 4 | 2 ≤ K' < 4 | 2, 1 |
| N = 8 | 5 ≤ K' < 8 | 4, 2, 1 |
| | 2 ≤ K' < 5 | 6, 5, 3 |
| N = 16 | 12 ≤ K' < 16 | 8, 4, 2, 1 |
| | 6 ≤ K' < 12 | 12, 10, 9, 6, 5, 3 |
| | 2 ≤ K' < 6 | 14, 13, 11, 7 |
| N = 32 | 27 ≤ K' < 32 | 16, 8, 4, 2, 1 |
| | 16 ≤ K' < 27 | 24, 20, 18, 12, 17, 10, 9, 6, 5, 3 |
| | 7 ≤ K' < 16 | 28, 26, 25, 22, 21, 14, 19, 13, 11, 7 |
| | 2 ≤ K' < 7 | 30, 29, 27, 23, 15 |
| N = 64 | 57 ≤ K' < 64 | 32, 16, 8, 4, 2, 1 |
| | 38 ≤ K' < 57 | 48, 40, 36, 24, 34, 20, 33, 18, 12, 17, 10, 9, 6, 5, 3 |
| | 19 ≤ K' < 38 | 56, 52, 50, 44, 49, 42, 28, 41, 38, 26, 37, 25, 22, 35, 21, 14, 19, 13, 11, 7 |
| | 7 ≤ K' < 19 | 60, 58, 57, 54, 53, 46, 51, 45, 30, 43, 29, 39, 27, 23, 15 |
| | 2 ≤ K' < 7 | 62, 61, 59, 55, 47, 31 |
| N = 128 | 117 ≤ K' < 128 | 64, 32, 16, 8, 4, 2, 1 |
| | 85 ≤ K' < 117 | 96, 80, 72, 48, 68, 40, 66, 65, 36, 24, 34, 20, 33, 18, 12, 17, 10, 9, 6, 5, 3 |
| | 47 ≤ K' < 85 | 112, 104, 100, 88, 98, 84, 97, 56, 82, 76, 81, 52, 74, 50, 73, 44, 70, 49, 42, 69, 28, 41, 67, 38, 26, 37, 25, 22, 35, 21, 14, 19, 13, 11, 7 |
| | 20 ≤ K' < 47 | 120, 116, 114, 108, 113, 106, 92, 105, 102, 90, 101, 89, 60, 86, 99, 58, 85, 78, 57, 83, 54, 77, 53, 75, 46, 51, 45, 71, 30, 43, 29, 39, 27, 23, 15 |
| | 7 ≤ K' < 20 | 124, 122, 121, 118, 117, 110, 115, 109, 94, 107, 93, 103, 91, 62, 61, 87, 59, 79, 55, 47, 31 |
| | 2 ≤ K' < 7 | 126, 125, 123, 119, 111, 95, 63 |
| N = 256 | 240 ≤ K' < 256 | 128, 64, 32, 16, 8, 4, 2, 1 |
| | 183 ≤ K' < 240 | 192, 160, 144, 96, 136, 80, 132, 130, 72, 48, 129, 68, 40, 66, 65, 36, 24, 34, 20, 33, 18, 12, 17, 10, 9, 6, 5, 3 |
| | 109 ≤ K' < 183 | 224, 208, 200, 176, 196, 168, 194, 112, 193, 164, 152, 162, 104, 148, 161, 100, 146, 88, 140, 98, 145, 84, 138, 97, 56, 137, 82, 134, 76, 81, 52, 133, 74, 50, 131, 73, 44, 70, 49, 42, 69, 28, 41, 67, 38, 26, 37, 25, 22, 35, 21, 14, 19, 13, 11, 7 |
| | 52 ≤ K' < 109 | 240, 232, 228, 216, 226, 212, 225, 184, 210, 204, 209, 180, 202, 178, 120, 201, 172, 198, 177, 116, 170, 197, 156, 169, 114, 195, 166, 108, 154, 113, 165, 106, 153, 150, 163, 92, 105, 102, 149, 90, 142, 101, 147, 89, 60, 141, 86, 99, 58, 85, 139, 78, 57, 83, 54, 135, 77, 53, 75, 46, 51, 45, 71, 30, 43, 29, 39, 27, 23, 15 |
| | 21 ≤ K' < 52 | 248, 244, 242, 236, 241, 234, 220, 233, 230, 218, 229, 217, 188, 214, 227, 186, 213, 206, 185, 211, 182, 124, 205, 181, 122, 203, |

TABLE 2-continued

Correspondence table of N, K', and possible second-type auxiliary bit subchannel numbers ranked in descending order of subchannel reliability

| | Value range of K' | Possible second-type auxiliary bit subchannel numbers |
|---|---|---|
| | | 174, 179, 121, 173, 118, 199, 158, 117, 171, 110, 157, 115, 167, 109, 155, 94, 107, 151, 93, 103, 91, 62, 143, 61, 87, 59, 79, 55, 47, 31 |
| | 7 ≤ K' < 21 | 252, 250, 249, 246, 245, 238, 243, 237, 222, 235, 221, 231, 219, 190, 189, 215, 187, 126, 207, 183, 125, 123, 175, 119, 159, 111, 95, 63 |
| | 2 ≤ K' < 7 | 254, 253, 251, 247, 239, 223, 191, 127 |
| N = 512 | 487 ≤ K' < 512 | 256, 128, 64, 32, 16, 8, 4, 2, 1 |
| | 387 ≤ K' < 487 | 384, 320, 288, 192, 272, 160, 264, 260, 144, 96, 258, 136, 257, 80, 132, 130, 72, 48, 129, 68, 40, 66, 65, 36, 24, 34, 20, 33, 18, 12, 17, 10, 9, 6, 5, 3 |
| | 243 ≤ K' < 387 | 448, 416, 400, 352, 392, 336, 388, 224, 386, 328, 304, 385, 324, 208, 296, 322, 200, 321, 292, 176, 280, 196, 290, 168, 276, 194, 289, 112, 193, 274, 164, 268, 152, 273, 162, 104, 266, 148, 161, 265, 100, 262, 146, 88, 140, 261, 98, 145, 84, 138, 97, 259, 56, 137, 82, 134, 76, 81, 52, 133, 74, 50, 131, 73, 44, 70, 49, 42, 69, 28, 41, 67, 38, 26, 37, 25, 22, 35, 21, 14, 19, 13, 11, 7 |
| | 125 ≤ K' < 243 | 480, 464, 456, 432, 452, 424, 450, 368, 449, 420, 408, 418, 360, 404, 417, 356, 240, 402, 344, 396, 354, 401, 232, 340, 394, 353, 312, 393, 338, 228, 390, 332, 216, 337, 308, 389, 226, 330, 212, 225, 306, 387, 329, 300, 326, 184, 210, 305, 204, 298, 325, 209, 180, 284, 202, 297, 323, 294, 178, 120, 201, 282, 172, 198, 293, 177, 281, 116, 170, 197, 278, 291, 156, 169, 277, 114, 195, 166, 108, 270, 154, 113, 275, 165, 269, 106, 153, 150, 163, 92, 105, 267, 102, 149, 90, 142, 101, 263, 147, 89, 60, 141, 86, 99, 58, 85, 139, 78, 57, 83, 54, 135, 77, 53, 75, 46, 51, 45, 71, 30, 43, 29, 39, 27, 23, 15 |
| | 55 ≤ K' < 125 | 496, 488, 484, 472, 482, 468, 481, 440, 466, 460, 465, 436, 458, 434, 376, 457, 428, 454, 433, 372, 426, 453, 412, 425, 370, 451, 422, 364, 248, 410, 369, 421, 362, 409, 244, 406, 419, 348, 361, 358, 405, 242, 346, 236, 398, 357, 241, 403, 345, 316, 397, 234, 342, 355, 220, 233, 314, 341, 395, 230, 334, 218, 313, 339, 229, 310, 391, 333, 217, 188, 214, 309, 227, 331, 302, 186, 213, 307, 206, 301, 327, 185, 211, 182, 124, 205, 286, 299, 181, 285, 122, 203, 174, 295, 179, 121, 283, 173, 118, 199, 158, 117, 171, 279, 110, 157, 115, 167, 109, 271, 155, 94, 107, 151, 93, 103, 91, 62, 143, 61, 87, 59, 79, 55, 47, 31 |
| | 21 ≤ K' < 55 | 504, 500, 498, 492, 497, 490, 476, 489, 486, 474, 485, 473, 444, 470, 483, 442, 469, 462, 441, 467, 438, 380, 461, 437, 378, 459, 430, 435, 377, 429, 374, 455, 252, 414, 373, 427, 366, 413, 250, 371, 423, 365, 249, 411, 246, 350, 363, 245, 407, 349, 238, 359, 243, 347, 237, 318, 399, 222, 317, 235, 343, 221, 315, 231, 335, 219, 190, 311, 189, 215, 303, 187, 126, 207, 183, 125, 287, 123, 175, 119, 159, 111, 95, 63 |
| | 7 ≤ K' < 21 | 508, 506, 505, 502, 501, 494, 499, 493, 478, 491, 477, 487, 475, 446, 445, 471, 443, 382, 463, 439, 381, 379, 431, 254, 375, 253, 415, 367, 251, 247, 351, 239, 319, 223, 191, 127 |
| | 2 ≤ K' < 7 | 510, 509, 507, 503, 495, 479, 447, 383, 255 |
| N = 1024 | 984 ≤ K' < 1024 | 512, 256, 128, 64, 32, 16, 8, 4, 2, 1 |
| | 805 ≤ K' < 984 | 768, 640, 576, 384, 544, 320, 528, 520, 288, 192, 516, 272, 514, 513, 160, 264, 260, 144, 96, 258, 136, 257, 80, 132, 130, 72, 48, 129, 68, 40, 66, 65, 36, 24, 34, 20, 33, 18, 12, 17, 10, 9, 6, 5, 3 |
| | 531 ≤ K' < 805 | 896, 832, 800, 704, 784, 672, 776, 448, 772, 656, 608, 770, 648, 769, 416, 592, 644, 400, 642, 584, 352, 569, 641, 392, 589, 336, 552, 388, 578, 577, 224, 386, 548, 328, 536, 304, 385, 546, 324, 208, 532, 545, 296, 322, 530, 200, 524, 321, 292, 529, 176, 280, 522, 196, 290, 521, 168, 276, 194, 289, 518, 112, 193, 274, 517, 164, 268, 152, 273, 515, 162, 104, 266, 148, 161, 265, 100, 262, 146, 88, 140, 261, 98, 145, 84, 138, 97, 259, 56, 137, 82, 134, 76, 81, 52, 133, 74, 50, 131, 73, 44, 70, 49, 42, 69, 28, 41, 67, 38, 26, 37, 25, 22, 35, 21, 14, 19, 13, 11, 7 |
| | 287 ≤ K' < 531 | 960, 928, 912, 864, 904, 848, 900, 736, 898, 840, 816, 897, 836, 720, 808, 834, 712, 833, 480, 804, 688, 792, 708, 802, 464, 680, 788, 706, 801, 624, 705, 786, 676, 456, 780, 664, 785, 432, 674, 616, 778, 452, 660, 673, 777, 424, 450, 612, 774, 658, 600, 652, 368, 449, 773, 420, 610, 657, 408, 596, 650, 609, 771, 418, 360, 568, 649, 404, 594, 417, 646, 588, 356, 593, 240, 402, 564, 645, 344, 396, 586, 354, 401, 562, 643, 585, 232, 340, 394, 556, 353, 582, 561, 312, 393, 338, 554, 581, 228, 390, 332, 216, 540, 337, 553, 308, 389, 579, 226, 550, 330, 538, 212, 225, 306, 387, 549, 329, 300, 537, 326, 184, 210, 305, 534, 547, 204, 298, 325, 209, 533, 180, 284, 202, 297, 526, 323, 294, 531, 178, 120, 201, 282, 525, 172, 198, 293, 177, 281, 523, 116, 170, 197, 278, 291, 156, 169, 277, 114, 195, 519, 166, 108, 270, 154, 113, 275, 165, 269, |

TABLE 2-continued

Correspondence table of N, K', and possible second-type auxiliary bit subchannel numbers ranked in descending order of subchannel reliability

| Value range of K' | Possible second-type auxiliary bit subchannel numbers |
|---|---|
| | 106, 153, 150, 163, 92, 105, 267, 102, 149, 90, 142, 101, 263, 147, 89, 60, 141, 86, 99, 58, 85, 139, 78, 57, 83, 54, 135, 77, 53, 75, 46, 51, 45, 71, 30, 43, 29, 39, 27, 23, 15 |
| $134 \leq K' < 287$ | 992, 976, 968, 944, 964, 936, 962, 880, 961, 932, 920, 930, 872, 916, 929, 868, 752, 914, 856, 908, 866, 913, 744, 852, 906, 865, 824, 905, 850, 740, 902, 844, 728, 849, 496, 820, 901, 738, 842, 724, 737, 818, 899, 841, 488, 812, 838, 696, 722, 817, 716, 810, 837, 484, 721, 692, 472, 796, 714, 809, 835, 482, 806, 690, 632, 713, 794, 468, 684, 481, 710, 805, 689, 793, 440, 466, 628, 682, 709, 790, 803, 460, 668, 465, 681, 789, 436, 626, 707, 678, 458, 620, 782, 666, 625, 787, 434, 677, 376, 457, 781, 428, 618, 665, 454, 433, 662, 675, 604, 617, 779, 372, 426, 453, 614, 661, 412, 602, 425, 654, 370, 451, 613, 775, 422, 659, 364, 601, 248, 410, 572, 653, 369, 598, 421, 611, 362, 409, 570, 597, 651, 244, 406, 419, 348, 361, 590, 569, 358, 405, 595, 242, 566, 647, 346, 589, 236, 398, 357, 241, 403, 565, 345, 316, 397, 587, 234, 342, 558, 355, 563, 220, 233, 314, 341, 395, 557, 583, 230, 334, 218, 313, 542, 339, 555, 229, 310, 391, 333, 217, 541, 188, 214, 309, 227, 551, 331, 302, 539, 186, 213, 307, 206, 301, 327, 185, 211, 535, 182, 124, 205, 286, 299, 181, 285, 122, 203, 527, 174, 295, 179, 121, 283, 173, 118, 199, 158, 117, 171, 279, 110, 157, 115, 167, 109, 271, 155, 94, 107, 151, 93, 103, 91, 62, 143, 61, 87, 59, 79, 55, 47, 31 |
| $56 \leq K' < 134$ | 1008, 1000, 996, 984, 994, 980, 993, 952, 978, 972, 977, 948, 970, 946, 888, 969, 940, 966, 945, 884, 938, 965, 924, 937, 882, 963, 934, 876, 760, 922, 881, 933, 874, 921, 756, 918, 931, 860, 873, 870, 917, 754, 858, 748, 910, 869, 753, 915, 857, 504, 828, 909, 746, 854, 867, 732, 745, 826, 853, 907, 500, 742, 846, 730, 825, 851, 498, 741, 822, 903, 845, 492, 729, 700, 497, 726, 821, 739, 843, 490, 814, 698, 725, 819, 476, 489, 718, 813, 839, 697, 486, 723, 694, 474, 636, 717, 798, 811, 485, 693, 473, 797, 444, 634, 715, 470, 686, 483, 807, 691, 633, 795, 442, 469, 685, 630, 711, 462, 441, 670, 467, 629, 683, 791, 438, 380, 461, 622, 669, 437, 627, 679, 378, 459, 621, 783, 430, 667, 435, 377, 606, 429, 619, 374, 455, 663, 605, 252, 414, 373, 427, 615, 366, 413, 603, 250, 574, 655, 371, 423, 365, 249, 411, 573, 599, 246, 350, 363, 571, 245, 407, 349, 591, 238, 359, 243, 567, 347, 237, 318, 399, 222, 317, 235, 343, 559, 221, 315, 231, 335, 219, 543, 190, 311, 189, 215, 303, 187, 126, 207, 183, 125, 287, 123, 175, 119, 159, 111, 95, 63 |
| $21 \leq K' < 56$ | 1016, 1012, 1010, 1004, 1009, 1002, 988, 1001, 998, 986, 997, 985, 956, 982, 995, 954, 981, 974, 953, 979, 950, 892, 973, 949, 890, 971, 942, 947, 889, 941, 886, 967, 764, 926, 885, 939, 878, 925, 762, 883, 935, 877, 761, 923, 758, 862, 875, 757, 919, 861, 508, 750, 871, 755, 859, 506, 749, 830, 911, 505, 734, 829, 747, 855, 502, 733, 827, 501, 743, 847, 494, 731, 702, 499, 823, 493, 701, 727, 478, 491, 815, 699, 477, 638, 719, 487, 695, 475, 637, 799, 446, 445, 635, 471, 687, 443, 631, 382, 463, 671, 439, 381, 623, 379, 431, 607, 254, 375, 253, 415, 367, 251, 575, 247, 351, 239, 319, 223, 191, 127 |
| $7 \leq K' < 21$ | 1020, 1018, 1017, 1014, 1013, 1006, 1011, 1005, 990, 1003, 989, 999, 987, 958, 957, 983, 955, 894, 975, 951, 893, 891, 943, 766, 887, 765, 927, 879, 763, 759, 863, 510, 509, 751, 507, 831, 735, 503, 495, 703, 479, 639, 447, 383, 255 |
| $2 \leq K' < 7$ | 1022, 1021, 1019, 1015, 1007, 991, 959, 895, 767, 511 |

TABLE 3

Row weight transition point distribution in different mother code lengths

| Index t | 1 | 2 | 3 | 4 | 5 | 6 | 7 | 8 | 9 |
|---|---|---|---|---|---|---|---|---|---|
| N = 4 | 2 | | | | | | | | |
| N = 8 | 5 | 2 | | | | | | | |
| N = 16 | 12 | 6 | 2 | | | | | | |
| N = 32 | 27 | 16 | 7 | 2 | | | | | |
| N = 64 | 57 | 38 | 19 | 7 | 2 | | | | |
| N = 128 | 117 | 85 | 47 | 20 | 7 | 2 | | | |
| N = 256 | 240 | 183 | 109 | 52 | 21 | 7 | 2 | | |
| N = 512 | 487 | 387 | 243 | 125 | 55 | 21 | 7 | 2 | |
| N = 1024 | 984 | 805 | 531 | 287 | 134 | 56 | 21 | 7 | 2 |

Note: A number in rows in which different values of N are located in the table represents a row weight transition point $K_t$.

TABLE 4

Row weight transition point distribution and $W_{min}$ distribution in different mother code lengths

| t | 1 | 2 | 3 | 4 | 5 | 6 | 7 | 8 | 9 |
|---|---|---|---|---|---|---|---|---|---|
| $W_{min}$ | 2 | 4 | 8 | 16 | 32 | 64 | 128 | 256 | 512 |
| N = 4 | 2 | | | | | | | | |
| N = 8 | 5 | 2 | | | | | | | |
| N = 16 | 12 | 6 | 2 | | | | | | |
| N = 32 | 27 | 16 | 7 | 2 | | | | | |
| N = 64 | 57 | 38 | 19 | 7 | 2 | | | | |
| N = 128 | 117 | 85 | 47 | 20 | 7 | 2 | | | |
| N = 256 | 240 | 183 | 109 | 52 | 21 | 7 | 2 | | |
| N = 512 | 487 | 387 | 243 | 125 | 55 | 21 | 7 | 2 | |
| N = 1024 | 984 | 805 | 531 | 287 | 134 | 56 | 21 | 7 | 2 |

Note: A number in rows in which different values of N are located in the table represents a row weight transition point $K_t$.

TABLE 5

Correspondence, in the case of $N_{max} = 512$, between $W_{min}$ and possible second-type auxiliary bit position numbers ranked in descending order of subchannel numbers $N_{max} = 512$

| $W_{min}$ | Value range of K' | Possible second-type auxiliary bit subchannel position numbers |
|---|---|---|
| 2 | 487 ≤ K' < 512 | 256, 384, 448, 480, 496, 504, 508, 510, 511 |
| 4 | 387 ≤ K' < 487 | 128, 192, 224, 240, 248, 252, 254, 255, 320, 352, 368, 376, 380, 382, 383, 416, 432, 440, 444, 446, 447, 464, 472, 476, 478, 479, 488, 492, 494, 495, 500, 502, 503, 506, 507, 509 |
| 8 | 243 ≤ K' < 387 | 64, 96, 112, 120, 124, 126, 127, 160, 176, 184, 188, 190, 191, 208, 216, 220, 222, 223, 232, 236, 238, 239, 244, 246, 247, 250, 251, 253, 288, 304, 312, 316, 318, 319, 336, 344, 348, 350, 351, 360, 364, 366, 367, 372, 374, 375, 378, 379, 381, 400, 408, 412, 414, 415, 424, 428, 430, 431, 436, 438, 439, 442, 443, 445, 456, 460, 462, 463, 468, 470, 471, 474, 475, 477, 484, 486, 487, 490, 491, 493, 498, 499, 501, 505 |
| 16 | 125 ≤ K' < 243 | 32, 48, 56, 60, 62, 63, 80, 88, 92, 94, 95, 104, 108, 110, 111, 116, 118, 119, 122, 123, 125, 144, 152, 156, 158, 159, 168, 172, 174, 175, 180, 182, 183, 186, 187, 189, 200, 204, 206, 207, 212, 214, 215, 218, 219, 221, 228, 230, 231, 234, 235, 237, 242, 243, 245, 249, 272, 280, 284, 286, 287, 296, 300, 302, 303, 308, 310, 311, 314, 315, 317, 328, 332, 334, 335, 340, 342, 343, 346, 347, 349, 356, 358, 359, 362, 363, 365, 370, 371, 373, 377, 392, 396, 398, 399, 404, 406, 407, 410, 411, 413, 420, 422, 423, 426, 427, 429, 434, 435, 437, 441, 452, 454, 455, 458, 459, 461, 466, 467, 469, 473, 482, 483, 485, 489, 497 |
| 32 | 55 ≤ K' < 125 | 16, 24, 28, 30, 31, 40, 44, 46, 47, 52, 54, 55, 58, 59, 61, 72, 76, 78, 79, 84, 86, 87, 90, 91, 93, 100, 102, 103, 106, 107, 109, 114, 115, 117, 121, 136, 140, 142, 143, 148, 150, 151, 154, 155, 157, 164, 166, 167, 170, 171, 173, 178, 179, 181, 185, 196, 198, 199, 202, 203, 205, 210, 211, 213, 217, 226, 227, 229, 233, 241, 264, 268, 270, 271, 276, 278, 279, 282, 283, 285, 292, 294, 295, 298, 299, 301, 306, 307, 309, 313, 324, 326, 327, 330, 331, 333, 338, 339, 341, 345, 354, 355, 357, 361, 369, 388, 390, 391, 394, 395, 397, 402, 403, 405, 409, 418, 419, 421, 425, 433, 450, 451, 453, 457, 465, 481 |
| 64 | 21 ≤ K' < 55 | 8, 12, 14, 15, 20, 22, 23, 26, 27, 29, 36, 38, 39, 42, 43, 45, 50, 51, 53, 57, 68, 70, 71, 74, 75, 77, 82, 83, 85, 89, 98, 99, 101, 105, 113, 132, 134, 135, 138, 139, 141, 146, 147, 149, 153, 162, 163, 165, 169, 177, 194, 195, 197, 201, 209, 225, 260, 262, 263, 266, 267, 269, 274, 275, 277, 281, 290, 291, 293, 297, 305, 322, 323, 325, 329, 337, 353, 386, 387, 389, 393, 401, 417, 449 |
| 128 | 7 ≤ K' < 21 | 4, 6, 7, 10, 11, 13, 18, 19, 21, 25, 34, 35, 37, 41, 49, 66, 67, 69, 73, 81, 97, 130, 131, 133, 137, 145, 161, 193, 258, 259, 261, 265, 273, 289, 321, 385 |
| 256 | 2 ≤ K' < 7 | 2, 3, 5, 9, 17, 33, 65, 129, 257 |

Note: A subchannel number of a selected second-type auxiliary bit is $N-X_j$, where j=1, 2, ... or J'.

TABLE 6

Correspondence, in the case of $N_{max} = 512$, between $W_{min}$ and possible second-type auxiliary bit position numbers ranked in descending order of reliability $N_{max} = 512$

| $W_{min}$ | Value range of K' | Possible second-type auxiliary bit subchannel position numbers |
|---|---|---|
| 2 | 487 ≤ K' < 512 | 256, 384, 448, 480, 496, 504, 508, 510, 511 |
| 4 | 387 ≤ K' < 487 | 128, 192, 224, 320, 240, 352, 248, 252, 368, 416, 254, 376, 255, 432, 380, 382, 440, 464, 383, 444, 472, 446, 447, 476, 488, 478, 492, 479, 494, 500, 495, 502, 503, 506, 507, 509 |
| 8 | 243 ≤ K' < 387 | 64, 96, 112, 160, 120, 176, 124, 288, 126, 184, 208, 127, 188, 304, 216, 190, 312, 191, 220, 336, 232, 316, 222, 344, 236, 318, 223, 400, 319, 238, 348, 244, 360, 239, 350, 408, 246, 364, 351, 247, 412, 250, 366, 424, 372, 251, 414, 367, 428, 374, 415, 253, 456, 375, 430, 378, 436, 431, 460, 379, 438, 462, 381, 439, 468, 442, 463, 470, 443, 484, 471, 445, 474, 486, 475, 487, 490, 477, 491, 498, 493, 499, 501, 505 |
| 16 | 125 ≤ K' < 243 | 32, 48, 56, 80, 60, 88, 62, 144, 63, 92, 104, 94, 152, 108, 95, 156, 272, 110, 168, 116, 158, 111, 280, 172, 118, 159, 200, 119, 174, 284, 122, 180, 296, 175, 204, 123, 286, 182, 300, 287, 206, 125, 183, 212, 186, 328, 302, 207, 308, 214, 187, 303, 332, 228, 310, 215, 189, 218, 334, 392, 311, 230, 340, 314, 219, 335, 231, 396, 342, 315, 234, 221, 356, 343, 235, 398, 317, 346, 404, 242, 358, 399, 237, 347, 243, 406, 359, 362, 349, 420, 407, 245, 410, 363, 422, 370, 411, 249, 365, 423, 452, 371, 426, 413, 454, 427, 373, 434, 455, 429, 458, 377, 435, 459, 437, 466, 461, 467, 441, 482, 469, 483, 473, 485, 489, 497 |
| 32 | 55 ≤ K' < 125 | 16, 24, 28, 40, 30, 44, 31, 72, 46, 52, 47, 76, 54, 78, 136, 55, 84, 58, 79, 140, 86, 59, 100, 87, 142, 61, 90, 148, 264, 102, 143, 91, 150, 103, 268, 106, 93, 164, 151, 154, 107, 270, 166, 276, 114, 155, 271, 109, 167, 196, 115, 278, 170, 157, 292, 279, 198, 171, 117, 282, 178, 294, 199, 173, 283, 202, 121, 179, 295, 324, 298, 203, 285, 181, 210, 326, 299, 205, 306, 211, 185, 327, 301, 330, 388, 307, 226, 213, 331, 227, 390, 309, 338, 217, 333, 391, 229, 339, 394, 313, 354, 395, 341, 233, 402, 355, 397, 345, 403, 241, 357, 418, 405, 361, 419, 409, 421, 450, 369, 451, 425, 453, 433, 457, 465, 481 |
| 64 | 21 ≤ K' < 55 | 8, 12, 14, 20, 15, 22, 36, 23, 26, 38, 27, 39, 68, 42, 29, 70, 43, 50, 71, 45, 74, 132, 51, 75, 134, 53, 82, 77, 135, 83, 138, 57, 260, 98, 139, 85, 146, 99, 262, 141, 89, 147, 263, 101, 266, 162, 149, 267, 105, 163, 274, 153, 269, 165, 275, 194, 113, 290, 195, 277, 169, 291, 197, 281, 177, 293, 322, 201, 323, 297, 209, 325, 386, 305, 329, 387, 225, 389, 337, 393, 353, 401, 417, 449 |
| 128 | 7 ≤ K' < 21 | 4, 6, 7, 10, 11, 18, 13, 19, 34, 21, 35, 25, 37, 66, 67, 41, 69, 130, 49, 73, 131, 133, 81, 258, 137, 259, 97, 145, 261, 265, 161, 273, 193, 289, 321, 385 |
| 256 | 2 ≤ K' < 7 | 2, 3, 5, 9, 17, 33, 65, 129, 257 |

Note: A subchannel number of a selected second-type auxiliary bit is $N-X_j$, where j=1, 2, ... or J'.

TABLE 7

Correspondence, in the case of $N_{max} = 1024$, between $W_{min}$ and possible second-type auxiliary bit position numbers ranked in descending order of subchannel numbers $N_{max} = 1024$

| $W_{min}$ | Value range of K' | Possible second-type auxiliary bit subchannel position numbers |
|---|---|---|
| 2 | 984 ≤ K' < 1024 | 512, 768, 896, 960, 992, 1008, 1016, 1020, 1022, 1023 |
| 4 | 805 ≤ K' < 984 | 256, 384, 448, 480, 496, 504, 508, 510, 511, 640, 704, 736, 752, 760, 764, 766, 767, 832, 864, 880, 888, 892, 894, 895, 928, 944, 952, 956, 958, 959, 976, 984, 988, 990, 991, 1000, 1004, 1006, 1007, 1012, 1014, 1015, 1018, 1019, 1021 |
| 8 | 531 ≤ K' < 805 | 128, 192, 224, 240, 248, 252, 254, 255, 320, 352, 368, 376, 380, 382, 383, 416, 432, 440, 444, 446, 447, 464, 472, 476, 478, 479, 488, 492, 494, 495, 500, 502, 503, 506, 507, 509, |

TABLE 7-continued

Correspondence, in the case of $N_{max} = 1024$, between $W_{min}$ and possible second-type auxiliary bit position numbers ranked in descending order of subchannel numbers $N_{max} = 1024$

| $W_{min}$ | Value range of K' | Possible second-type auxiliary bit subchannel position numbers |
|---|---|---|
| | | 576, 608, 624, 632, 636, 638, 639, 672, 688, 696, 700, 702, 703, 720, 728, 732, 734, 735, 744, 748, 750, 751, 756, 758, 759, 762, 763, 765, 800, 816, 824, 828, 830, 831, 848, 856, 860, 862, 863, 872, 876, 878, 879, 884, 886, 887, 890, 891, 893, 912, 920, 924, 926, 927, 936, 940, 942, 943, 948, 950, 951, 954, 955, 957, 968, 972, 974, 975, 980, 982, 983, 986, 987, 989, 996, 998, 999, 1002, 1003, 1005, 1010, 1011, 1013, 1017 |
| 16 | $287 \le K' < 531$ | 64, 96, 112, 120, 124, 126, 127, 160, 176, 184, 188, 190, 191, 208, 216, 220, 222, 223, 232, 236, 238, 239, 244, 246, 247, 250, 251, 253, 288, 304, 312, 316, 318, 319, 336, 344, 348, 350, 351, 360, 364, 366, 367, 372, 374, 375, 378, 379, 381, 400, 408, 412, 414, 415, 424, 428, 430, 431, 436, 438, 439, 442, 443, 445, 456, 460, 462, 463, 468, 470, 471, 474, 475, 477, 484, 486, 487, 490, 491, 493, 498, 499, 501, 505, 544, 560, 568, 572, 574, 575, 592, 600, 604, 606, 607, 616, 620, 622, 623, 628, 630, 631, 634, 635, 637, 656, 664, 668, 670, 671, 680, 684, 686, 687, 692, 694, 695, 698, 699, 701, 712, 716, 718, 719, 724, 726, 727, 730, 731, 733, 740, 742, 743, 746, 747, 749, 754, 755, 757, 761, 784, 792, 796, 798, 799, 808, 812, 814, 815, 820, 822, 823, 826, 827, 829, 840, 844, 846, 847, 852, 854, 855, 858, 859, 861, 868, 870, 871, 874, 875, 877, 882, 883, 885, 889, 904, 908, 910, 911, 916, 918, 919, 922, 923, 925, 932, 934, 935, 938, 939, 941, 946, 947, 949, 953, 964, 966, 967, 970, 971, 973, 978, 979, 981, 985, 994, 995, 997, 1001, 1009 |
| 32 | $134 \le K' < 287$ | 32, 48, 56, 60, 62, 63, 80, 88, 92, 94, 95, 104, 108, 110, 111, 116, 118, 119, 122, 123, 125, 144, 152, 156, 158, 159, 168, 172, 174, 175, 180, 182, 183, 186, 187, 189, 200, 204, 206, 207, 212, 214, 215, 218, 219, 221, 228, 230, 231, 234, 235, 237, 242, 243, 245, 249, 272, 280, 284, 286, 287, 296, 300, 302, 303, 308, 310, 311, 314, 315, 317, 328, 332, 334, 335, 340, 342, 343, 346, 347, 349, 356, 358, 359, 362, 363, 365, 370, 371, 373, 377, 392, 396, 398, 399, 404, 406, 407, 410, 411, 413, 420, 422, 423, 426, 427, 429, 434, 435, 437, 441, 452, 454, 455, 458, 459, 461, 466, 467, 469, 473, 482, 483, 485, 489, 497, 528, 536, 540, 542, 543, 552, 556, 558, 559, 564, 566, 567, 570, 571, 573, 584, 588, 590, 591, 596, 598, 599, 602, 603, 605, 612, 614, 615, 618, 619, 621, 626, 627, 629, 633, 648, 652, 654, 655, 660, 662, 663, 666, 667, 669, 676, 678, 679, 682, 683, 685, 690, 691, 693, 697, 708, 710, 711, 714, 715, 717, 722, 723, 725, 729, 738, 739, 741, 745, 753, 776, 780, 782, 783, 788, 790, 791, 794, 795, 797, 804, 806, 807, 810, 811, 813, 818, 819, 821, 825, 836, 838, 839, 842, 843, 845, 850, 851, 853, 857, 866, 867, 869, 873, 881, 900, 902, 903, 906, 907, 909, 914, 915, 917, 921, 930, 931, 933, 937, 945, 962, 963, 965, 969, 977, 993 |
| 64 | $56 \le K' < 134$ | 16, 24, 28, 30, 31, 40, 44, 46, 47, 52, 54, 55, 58, 59, 61, 72, 76, 78, 79, 84, 86, 87, 90, 91, 93, 100, 102, 103, 106, 107, 109, 114, 115, 117, 121, 136, 140, 142, 143, 148, 150, 151, 154, 155, 157, 164, 166, 167, 170, 171, 173, 178, 179, 181, 185, 196, 198, 199, 202, 203, 205, 210, 211, 213, 217, 226, 227, 229, 233, 241, 264, 268, 270, 271, 276, 278, 279, 282, 283, 285, 292, 294, 295, 298, 299, 301, 306, 307, 309, 313, 324, 326, 327, 330, 331, 333, 338, 339, 341, 345, 354, 355, 357, 361, 369, 388, 390, 391, 394, 395, 397, 402, 403, 405, 409, 418, 419, 421, 425, 433, 450, 451, 453, 457, 465, 481, 520, 524, 526, 527, 532, 534, 535, 538, 539, 541, 548, 550, 551, 554, 555, 557, 562, 563, 565, 569, 580, 582, 583, 586, 587, 589, 594, 595, 597, 601, 610, 611, 613, 617, 625, 644, 646, 647, 650, 651, 653, 658, 659, 661, 665, 674, 675, 677, 681, 689, 706, 707, 709, 713, 721, 737, 772, 774, 775, 778, 779, 781, 786, 787, 789, 793, 802, 803, 805, 809, 817, 834, 835, 837, 841, 849, 865, 898, 899, 901, 905, 913, 929, 961 |
| 128 | $21 \le K' < 56$ | 8, 12, 14, 15, 20, 22, 23, 26, 27, 29, 36, 38, 39, 42, 43, 45, 50, 51, 53, 57, 68, 70, 71, 74, 75, 77, 82, 83, 85, 89, 98, 99, 101, 105, 113, 132, 134, 135, 138, 139, 141, 146, 147, 149, 153, 162, 163, 165, 169, 177, 194, 195, 197, 201, 209, 225, 260, 262, 263, 266, 267, 269, 274, 275, 277, 281, 290, 291, 293, 297, 305, 322, 323, 325, 329, 337, 353, 386, 387, 389, 393, 401, 417, 449, 516, 518, 519, 522, 523, 525, 530, 531, 533, 537, 546, 547, 549, 553, 561, 578, 579, 581, 585, 593, |

TABLE 7-continued

Correspondence, in the case of $N_{max}$ = 1024, between $W_{min}$ and possible second-type auxiliary bit position numbers ranked in descending order of subchannel numbers

| $W_{min}$ | Value range of K' | Possible second-type auxiliary bit subchannel position numbers ($N_{max}$ = 1024) |
|---|---|---|
| 256 | 7 ≤ K' < 21 | 609, 642, 643, 645, 649, 657, 673, 705, 770, 771, 773, 777, 785, 801, 833, 897<br>4, 6, 7, 10, 11, 13, 18, 19, 21, 25, 34, 35, 37, 41, 49, 66, 67, 69, 73, 81, 97, 130, 131, 133, 137, 145, 161, 193, 258, 259, 261, 265, 273, 289, 321, 385, 514, 515, 517, 521, 529, 545, 577, 641, 769 |
| 512 | 2 ≤ K' < 7 | 2, 3, 5, 9, 17, 33, 65, 129, 257, 513 |

Note: A subchannel number of a selected second-type auxiliary bit is $N-X_j$, where j=1, 2, ... or J'.

TABLE 8

Correspondence, in the case of $N_{max}$ = 1024, between $W_{min}$ and possible second-type auxiliary bit position numbers ranked in descending order of reliability

| $W_{min}$ | Value range of K' | Possible second-type auxiliary bit subchannel position numbers ($N_{max}$ = 1024) |
|---|---|---|
| 2 | 984 ≤ K' < 1024 | 512, 768, 896, 960, 992, 1008, 1016, 1020, 1022, 1023 |
| 4 | 805 ≤ K' < 984 | 256, 384, 448, 640, 480, 704, 496, 504, 736, 832, 508, 752, 510, 511, 864, 760, 764, 880, 928, 766, 888, 767, 944, 892, 894, 952, 976, 895, 956, 984, 958, 959, 988, 1000, 990, 1004, 991, 1006, 1012, 1007, 1014, 1015, 1018, 1019, 1021 |
| 8 | 531 ≤ K' < 805 | 128, 192, 224, 320, 240, 352, 248, 576, 252, 368, 416, 254, 376, 255, 608, 432, 380, 624, 382, 440, 672, 464, 383, 632, 444, 688, 472, 636, 446, 447, 800, 638, 476, 696, 488, 720, 639, 478, 700, 816, 492, 479, 728, 702, 494, 824, 500, 703, 732, 495, 848, 744, 502, 828, 734, 503, 856, 748, 830, 735, 506, 912, 831, 750, 507, 860, 756, 872, 751, 509, 862, 920, 758, 876, 863, 759, 924, 762, 878, 936, 884, 763, 926, 879, 940, 886, 927, 765, 968, 887, 942, 890, 948, 943, 972, 891, 950, 974, 893, 951, 980, 954, 975, 982, 955, 996, 983, 957, 986, 998, 987, 999, 1002, 989, 1003, 1010, 1005, 1011, 1013, 1017 |
| 16 | 287 ≤ K' < 531 | 64, 96, 112, 160, 120, 176, 124, 288, 126, 184, 208, 127, 188, 304, 216, 190, 312, 191, 544, 220, 336, 232, 316, 222, 560, 344, 236, 318, 223, 400, 319, 238, 348, 568, 244, 360, 239, 592, 350, 408, 246, 572, 364, 351, 247, 600, 574, 412, 250, 366, 424, 372, 656, 575, 251, 604, 414, 367, 616, 428, 374, 415, 253, 606, 664, 456, 375, 620, 430, 607, 378, 436, 668, 431, 784, 622, 460, 379, 680, 628, 438, 670, 623, 462, 381, 439, 792, 684, 630, 468, 671, 442, 463, 712, 631, 686, 470, 443, 796, 634, 692, 808, 484, 687, 471, 716, 635, 445, 798, 474, 694, 486, 812, 799, 718, 637, 475, 695, 724, 487, 698, 840, 814, 719, 490, 477, 820, 726, 699, 815, 491, 844, 740, 822, 727, 498, 701, 730, 493, 846, 904, 823, 742, 499, 852, 826, 731, 847, 743, 501, 908, 854, 827, 746, 733, 868, 855, 747, 910, 829, 505, 858, 916, 754, 870, 911, 749, 859, 755, 918, 871, 874, 861, 932, 919, 757, 922, 875, 934, 882, 923, 761, 877, 935, 964, 883, 938, 925, 966, 939, 885, 946, 967, 941, 970, 889, 947, 971, 949, 978, 973, 979, 953, 994, 981, 995, 985, 997, 1001, 1009 |
| 32 | 134 ≤ K' < 287 | 32, 48, 56, 80, 60, 88, 62, 144, 63, 92, 104, 94, 152, 108, 95, 156, 272, 110, 168, 116, 158, 111, 280, 172, 118, 159, 200, 119, 174, 284, 122, 180, 296, 175, 528, 204, 123, 286, 182, 300, 287, 206, 125, 183, 536, 212, 186, 328, 302, 207, 308, 214, 187, 540, 303, 332, 552, 228, 310, 215, 189, 542, 218, 334, 392, 311, 230, 556, 340, 543, 314, 219, 335, 231, 584, 558, 396, 342, 315, 234, 221, 564, 356, 559, 343, 235, 588, 398, 317, 346, 566, 404, 242, 358, 399, 237, 590, 347, 648, 567, 243, 596, 406, 359, 570, 591, 362, 349, 420, 407, 245, 652, 598, 571, 410, 363, 612, 422, 599, 370, 654, 573, 411, 249, 602, 365, 660, 423, 776, 614, 452, 371, 655, 426, 603, 413, 662, 615, 454, 427, 373, 780, 618, 605, 676, 663, 434, 455, 666, 619, 429, 782, 458, 377, 678, 435, 788, 626, 667, 783, 621, 459, 679, 708, 627, 437, 790, 682, 466, 669, 461, |

TABLE 8-continued

Correspondence, in the case of $N_{max} = 1024$, between $W_{min}$ and possible second-type auxiliary bit position numbers ranked in descending order of reliability $N_{max} = 1024$

| $W_{min}$ | Value range of K' | Possible second-type auxiliary bit subchannel position numbers |
|---|---|---|
| | | 804, 791, 710, 683, 629, 467, 441, 794, 690, 806, 711, 482, 685, 469, 795, 714, 633, 691, 807, 483, 836, 810, 715, 797, 473, 693, 722, 485, 838, 811, 717, 818, 723, 697, 839, 813, 489, 842, 900, 819, 738, 725, 843, 739, 902, 821, 497, 850, 729, 845, 903, 741, 851, 906, 825, 866, 907, 853, 745, 914, 867, 909, 857, 915, 753, 869, 930, 917, 873, 931, 921, 933, 962, 881, 963, 937, 965, 945, 969, 977, 993 |
| 64 | 56 ≤ K' < 134 | 16, 24, 28, 40, 30, 44, 31, 72, 46, 52, 47, 76, 54, 78, 136, 55, 84, 58, 79, 140, 86, 59, 100, 87, 142, 61, 90, 148, 264, 102, 143, 91, 150, 103, 268, 106, 93, 164, 151, 154, 107, 270, 166, 276, 114, 155, 271, 109, 167, 520, 196, 115, 278, 170, 157, 292, 279, 198, 171, 117, 524, 282, 178, 294, 199, 173, 526, 283, 202, 121, 179, 532, 295, 324, 527, 298, 203, 285, 181, 534, 210, 326, 299, 205, 548, 535, 306, 211, 185, 327, 538, 301, 330, 550, 388, 307, 226, 213, 539, 331, 551, 227, 580, 390, 309, 554, 338, 541, 217, 333, 391, 229, 582, 555, 339, 394, 313, 562, 583, 354, 557, 395, 341, 233, 586, 644, 563, 402, 355, 587, 397, 345, 646, 565, 403, 241, 594, 357, 589, 647, 418, 595, 405, 650, 569, 361, 419, 772, 610, 651, 597, 409, 658, 611, 421, 774, 450, 369, 653, 601, 659, 775, 613, 451, 425, 778, 674, 661, 453, 779, 617, 675, 433, 786, 665, 781, 457, 677, 787, 706, 625, 802, 707, 789, 681, 465, 803, 709, 793, 689, 805, 481, 834, 713, 835, 809, 721, 837, 898, 817, 841, 899, 737, 901, 849, 905, 865, 913, 929, 961 |
| 128 | 21 ≤ K' < 56 | 8, 12, 14, 20, 15, 22, 36, 23, 26, 38, 27, 39, 68, 42, 29, 70, 43, 50, 71, 45, 74, 132, 51, 75, 134, 53, 82, 77, 135, 83, 138, 57, 260, 98, 139, 85, 146, 99, 262, 141, 89, 147, 263, 101, 266, 162, 149, 267, 105, 163, 516, 274, 153, 269, 165, 518, 275, 194, 113, 519, 290, 195, 277, 169, 522, 291, 197, 523, 281, 177, 530, 293, 322, 525, 201, 531, 323, 297, 546, 533, 209, 325, 547, 386, 305, 537, 329, 549, 387, 225, 578, 579, 389, 553, 337, 581, 393, 642, 561, 353, 585, 643, 401, 645, 593, 417, 770, 649, 771, 609, 657, 773, 449, 777, 673, 785, 705, 801, 833, 897 |
| 256 | 7 ≤ K' < 21 | 4, 6, 7, 10, 11, 18, 13, 19, 34, 21, 35, 25, 37, 66, 67, 41, 69, 130, 49, 73, 131, 133, 81, 258, 137, 259, 97, 145, 261, 265, 161, 514, 515, 273, 517, 193, 289, 521, 529, 321, 545, 385, 577, 641, 769 |
| 512 | 2 ≤ K' < 7 | 2, 3, 5, 9, 17, 33, 65, 129, 257, 513 |

Note: A subchannel number of a selected second-type auxiliary bit is $N-X_j$, where j=1, 2, . . . or J'.

TABLE 9

Correspondence, in the case of $N_{max} = 512$, between an index and possible second-type auxiliary bit position numbers ranked in descending order of subchannel numbers $N_{max} = 512$

| Index number | Value range of K' | Possible second-type auxiliary bit subchannel position numbers |
|---|---|---|
| 1 | 487 ≤ K' < 512 | 256, 384, 448, 480, 496, 504, 508, 510, 511 |
| 2 | 387 ≤ K' < 487 | 128, 192, 224, 240, 248, 252, 254, 255, 320, 352, 368, 376, 380, 382, 383, 416, 432, 440, 444, 446, 447, 464, 472, 476, 478, 479, 488, 492, 494, 495, 500, 502, 503, 506, 507, 509 |
| 3 | 243 ≤ K' < 387 | 64, 96, 112, 120, 124, 126, 127, 160, 176, 184, 188, 190, 191, 208, 216, 220, 222, 223, 232, 236, 238, 239, 244, 246, 247, 250, 251, 253, 288, 304, 312, 316, 318, 319, 336, 344, 348, 350, 351, 360, 364, 366, 367, 372, 374, 375, 378, 379, 381, 400, 408, 412, 414, 415, 424, 428, 430, 431, 436, 438, 439, 442, 443, 445, 456, 460, 462, 463, 468, 470, 471, 474, 475, 477, 484, 486, 487, 490, 491, 493, 498, 499, 501, 505 |
| 4 | 125 ≤ K' < 243 | 32, 48, 56, 60, 62, 63, 80, 88, 92, 94, 95, 104, 108, 110, 111, 116, 118, 119, 122, 123, 125, 144, 152, 156, 158, 159, 168, 172, 174, 175, 180, 182, 183, 186, 187, 189, 200, 204, 206, 207, 212, 214, 215, 218, 219, 221, 228, 230, 231, 234, 235, 237, 242, 243, 245, 249, 272, 280, 284, 286, 287, 296, 300, |

TABLE 9-continued

Correspondence, in the case of $N_{max}$ = 512, between an index and possible second-type auxiliary bit position numbers ranked in descending order of subchannel numbers $N_{max}$ = 512

| Index number | Value range of K' | Possible second-type auxiliary bit subchannel position numbers |
|---|---|---|
| | | 302, 303, 308, 310, 311, 314, 315, 317, 328, 332, 334, 335, 340, 342, 343, 346, 347, 349, 356, 358, 359, 362, 363, 365, 370, 371, 373, 377, 392, 396, 398, 399, 404, 406, 407, 410, 411, 413, 420, 422, 423, 426, 427, 429, 434, 435, 437, 441, 452, 454, 455, 458, 459, 461, 466, 467, 469, 473, 482, 483, 485, 489, 497 |
| 5 | 55 ≤ K' < 125 | 16, 24, 28, 30, 31, 40, 44, 46, 47, 52, 54, 55, 58, 59, 61, 72, 76, 78, 79, 84, 86, 87, 90, 91, 93, 100, 102, 103, 106, 107, 109, 114, 115, 117, 121, 136, 140, 142, 143, 148, 150, 151, 154, 155, 157, 164, 166, 167, 170, 171, 173, 178, 179, 181, 185, 196, 198, 199, 202, 203, 205, 210, 211, 213, 217, 226, 227, 229, 233, 241, 264, 268, 270, 271, 276, 278, 279, 282, 283, 285, 292, 294, 295, 298, 299, 301, 306, 307, 309, 313, 324, 326, 327, 330, 331, 333, 338, 339, 341, 345, 354, 355, 357, 361, 369, 388, 390, 391, 394, 395, 397, 402, 403, 405, 409, 418, 419, 421, 425, 433, 450, 451, 453, 457, 465, 481 |
| 6 | 21 ≤ K' < 55 | 8, 12, 14, 15, 20, 22, 23, 26, 27, 29, 36, 38, 39, 42, 43, 45, 50, 51, 53, 57, 68, 70, 71, 74, 75, 77, 82, 83, 85, 89, 98, 99, 101, 105, 113, 132, 134, 135, 138, 139, 141, 146, 147, 149, 153, 162, 163, 165, 169, 177, 194, 195, 197, 201, 209, 225, 260, 262, 263, 266, 267, 269, 274, 275, 277, 281, 290, 291, 293, 297, 305, 322, 323, 325, 329, 337, 353, 386, 387, 389, 393, 401, 417, 449 |
| 7 | 7 ≤ K' < 21 | 4, 6, 7, 10, 11, 13, 18, 19, 21, 25, 34, 35, 37, 41, 49, 66, 67, 69, 73, 81, 97, 130, 131, 133, 137, 145, 161, 193, 258, 259, 261, 265, 273, 289, 321, 385 |
| 8 | 2 ≤ K' < 7 | 2, 3, 5, 9, 17, 33, 65, 129, 257 |

Note: A subchannel number of a selected second-type auxiliary bit is N−$X_j$, where j=1, 2, . . . or J'.

TABLE 10

Correspondence, in the case of $N_{max}$ = 512, between an index and possible second-type auxiliary bit position numbers ranked in descending order of reliability $N_{max}$ = 512

| Index number | Value range of K' | Possible second-type auxiliary bit subchannel position numbers |
|---|---|---|
| 1 | 487 ≤ K' < 512 | 256, 384, 448, 480, 496, 504, 508, 510, 511 |
| 2 | 387 ≤ K' < 487 | 128, 192, 224, 320, 240, 352, 248, 252, 368, 416, 254, 376, 255, 432, 380, 382, 440, 464, 383, 444, 472, 446, 447, 476, 488, 478, 492, 479, 494, 500, 495, 502, 503, 506, 507, 509 |
| 3 | 243 ≤ K' < 387 | 64, 96, 112, 160, 120, 176, 124, 288, 126, 184, 208, 127, 188, 304, 216, 190, 312, 191, 220, 336, 232, 316, 222, 344, 236, 318, 223, 400, 319, 238, 348, 244, 360, 239, 350, 408, 246, 364, 351, 247, 412, 250, 366, 424, 372, 251, 414, 367, 428, 374, 415, 253, 456, 375, 430, 378, 436, 431, 460, 379, 438, 462, 381, 439, 468, 442, 463, 470, 443, 484, 471, 445, 474, 486, 475, 487, 490, 477, 491, 498, 493, 499, 501, 505 |
| 4 | 125 ≤ K' < 243 | 32, 48, 56, 80, 60, 88, 62, 144, 63, 92, 104, 94, 152, 108, 95, 156, 272, 110, 168, 116, 158, 111, 280, 172, 118, 159, 200, 119, 174, 284, 122, 180, 296, 175, 204, 123, 286, 182, 300, 287, 206, 125, 183, 212, 186, 328, 302, 207, 308, 214, 187, 303, 332, 228, 310, 215, 189, 218, 334, 392, 311, 230, 340, 314, 219, 335, 231, 396, 342, 315, 234, 221, 356, 343, 235, 398, 317, 346, 404, 242, 358, 399, 237, 347, 243, 406, 359, 362, 349, 420, 407, 245, 410, 363, 422, 370, 411, 249, 365, 423, 452, 371, 426, 413, 454, 427, 373, 434, 455, 429, 458, 377, 435, 459, 437, 466, 461, 467, 441, 482, 469, 483, 473, 485, 489, 497 |
| 5 | 55 ≤ K' < 125 | 16, 24, 28, 40, 30, 44, 31, 72, 46, 52, 47, 76, 54, 78, 136, 55, 84, 58, 79, 140, 86, 59, 100, 87, 142, 61, 90, 148, 264, 102, 143, 91, 150, 103, 268, 106, 93, 164, 151, 154, 107, 270, 166, 276, 114, 155, 271, 109, 167, 196, 115, 278, 170, 157, 292, 279, 198, 171, 117, 282, 178, 294, 199, 173, 283, 202, 121, 179, 295, 324, 298, 203, 285, 181, 210, 326, 299, 205, |

TABLE 10-continued

Correspondence, in the case of $N_{max} = 512$, between an index and possible second-type auxiliary bit position numbers ranked in descending order of reliability $N_{max} = 512$

| Index number | Value range of K' | Possible second-type auxiliary bit subchannel position numbers |
|---|---|---|
| 6 | $21 \leq K' < 55$ | 306, 211, 185, 327, 301, 330, 388, 307, 226, 213, 331, 227, 390, 309, 338, 217, 333, 391, 229, 339, 394, 313, 354, 395, 341, 233, 402, 355, 397, 345, 403, 241, 357, 418, 405, 361, 419, 409, 421, 450, 369, 451, 425, 453, 433, 457, 465, 481 8, 12, 14, 20, 15, 22, 36, 23, 26, 38, 27, 39, 68, 42, 29, 70, 43, 50, 71, 45, 74, 132, 51, 75, 134, 53, 82, 77, 135, 83, 138, 57, 260, 98, 139, 85, 146, 99, 262, 141, 89, 147, 263, 101, 266, 162, 149, 267, 105, 163, 274, 153, 269, 165, 275, 194, 113, 290, 195, 277, 169, 291, 197, 281, 177, 293, 322, 201, 323, 297, 209, 325, 386, 305, 329, 387, 225, 389, 337, 393, 353, 401, 417, 449 |
| 7 | $7 \leq K' < 21$ | 4, 6, 7, 10, 11, 18, 13, 19, 34, 21, 35, 25, 37, 66, 67, 41, 69, 130, 49, 73, 131, 133, 81, 258, 137, 259, 97, 145, 261, 265, 161, 273, 193, 289, 321, 385 |
| 8 | $2 \leq K' < 7$ | 2, 3, 5, 9, 17, 33, 65, 129, 257 |

Note: A subchannel number of a selected second-type auxiliary bit is $N-X_j$, where $j=1, 2, \ldots$ or $J'$.

TABLE 11

Correspondence, in the case of $N_{max} = 1024$, between an index and possible second-type auxiliary bit position numbers ranked in descending order of subchannel numbers $N_{max} = 1024$

| Index number | Value range of K' | Possible second-type auxiliary bit subchannel position numbers |
|---|---|---|
| 1 | $984 \leq K' < 1024$ | 512, 768, 896, 960, 992, 1008, 1016, 1020, 1022, 1023 |
| 2 | $805 \leq K' < 984$ | 256, 384, 448, 480, 496, 504, 508, 510, 511, 640, 704, 736, 752, 760, 764, 766, 767, 832, 864, 880, 888, 892, 894, 895, 928, 944, 952, 956, 958, 959, 976, 984, 988, 990, 991, 1000, 1004, 1006, 1007, 1012, 1014, 1015, 1018, 1019, 1021 |
| 3 | $531 \leq K' < 805$ | 128, 192, 224, 240, 248, 252, 254, 255, 320, 352, 368, 376, 380, 382, 383, 416, 432, 440, 444, 446, 447, 464, 472, 476, 478, 479, 488, 492, 494, 495, 500, 502, 503, 506, 507, 509, 576, 608, 624, 632, 636, 638, 639, 672, 688, 696, 700, 702, 703, 720, 728, 732, 734, 735, 744, 748, 750, 751, 756, 758, 759, 762, 763, 765, 800, 816, 824, 828, 830, 831, 848, 856, 860, 862, 863, 872, 876, 878, 879, 884, 886, 887, 890, 891, 893, 912, 920, 924, 926, 927, 936, 940, 942, 943, 948, 950, 951, 954, 955, 957, 968, 972, 974, 975, 980, 982, 983, 986, 987, 989, 996, 998, 999, 1002, 1003, 1005, 1010, 1011, 1013, 1017 |
| 4 | $287 \leq K' < 531$ | 64, 96, 112, 120, 124, 126, 127, 160, 176, 184, 188, 190, 191, 208, 216, 220, 222, 223, 232, 236, 238, 239, 244, 246, 247, 250, 251, 253, 288, 304, 312, 316, 318, 319, 336, 344, 348, 350, 351, 360, 364, 366, 367, 372, 374, 375, 378, 379, 381, 400, 408, 412, 414, 415, 424, 428, 430, 431, 436, 438, 439, 442, 443, 445, 456, 460, 462, 463, 468, 470, 471, 474, 475, 477, 484, 486, 487, 490, 491, 493, 498, 499, 501, 505, 544, 560, 568, 572, 574, 575, 592, 600, 604, 606, 607, 616, 620, 622, 623, 628, 630, 631, 634, 635, 637, 656, 664, 668, 670, 671, 680, 684, 686, 687, 692, 694, 695, 698, 699, 701, 712, 716, 718, 719, 724, 726, 727, 730, 731, 733, 740, 742, 743, 746, 747, 749, 754, 755, 757, 761, 784, 792, 796, 798, 799, 808, 812, 814, 815, 820, 822, 823, 826, 827, 829, 840, 844, 846, 847, 852, 854, 855, 858, 859, 861, 868, 870, 871, 874, 875, 877, 882, 883, 885, 889, 904, 908, 910, 911, 916, 918, 919, 922, 923, 925, 932, 934, 935, 938, 939, 941, 946, 947, 949, 953, 964, 966, 967, 970, 971, 973, 978, 979, 981, 985, 994, 995, 997, 1001, 1009 |
| 5 | $134 \leq K' < 287$ | 32, 48, 56, 60, 62, 63, 80, 88, 92, 94, 95, 104, 108, 110, 111, 116, 118, 119, 122, 123, 125, 144, 152, 156, 158, 159, 168, 172, 174, 175, 180, 182, 183, 186, 187, 189, 200, 204, 206, 207, 212, 214, 215, 218, 219, 221, 228, 230, 231, 234, 235, 237, 242, 243, 245, 249, 272, 280, 284, 286, 287, 296, 300, 302, 303, 308, 310, 311, 314, 315, 317, 328, 332, 334, 335, |

TABLE 11-continued

Correspondence, in the case of $N_{max} = 1024$, between an index and possible second-type auxiliary bit position numbers ranked in descending order of subchannel numbers $N_{max} = 1024$

| Index number | Value range of K' | Possible second-type auxiliary bit subchannel position numbers |
|---|---|---|
| | | 340, 342, 343, 346, 347, 349, 356, 358, 359, 362, 363, 365, 370, 371, 373, 377, 392, 396, 398, 399, 404, 406, 407, 410, 411, 413, 420, 422, 423, 426, 427, 429, 434, 435, 437, 441, 452, 454, 455, 458, 459, 461, 466, 467, 469, 473, 482, 483, 485, 489, 497, 528, 536, 540, 542, 543, 552, 556, 558, 559, 564, 566, 567, 570, 571, 573, 584, 588, 590, 591, 596, 598, 599, 602, 603, 605, 612, 614, 615, 618, 619, 621, 626, 627, 629, 633, 648, 652, 654, 655, 660, 662, 663, 666, 667, 669, 676, 678, 679, 682, 683, 685, 690, 691, 693, 697, 708, 710, 711, 714, 715, 717, 722, 723, 725, 729, 738, 739, 741, 745, 753, 776, 780, 782, 783, 788, 790, 791, 794, 795, 797, 804, 806, 807, 810, 811, 813, 818, 819, 821, 825, 836, 838, 839, 842, 843, 845, 850, 851, 853, 857, 866, 867, 869, 873, 881, 900, 902, 903, 906, 907, 909, 914, 915, 917, 921, 930, 931, 933, 937, 945, 962, 963, 965, 969, 977, 993 |
| 6 | $56 \leq K' < 134$ | 16, 24, 28, 30, 31, 40, 44, 46, 47, 52, 54, 55, 58, 59, 61, 72, 76, 78, 79, 84, 86, 87, 90, 91, 93, 100, 102, 103, 106, 107, 109, 114, 115, 117, 121, 136, 140, 142, 143, 148, 150, 151, 154, 155, 157, 164, 166, 167, 170, 171, 173, 178, 179, 181, 185, 196, 198, 199, 202, 203, 205, 210, 211, 213, 217, 226, 227, 229, 233, 241, 264, 268, 270, 271, 276, 278, 279, 282, 283, 285, 292, 294, 295, 298, 299, 301, 306, 307, 309, 313, 324, 326, 327, 330, 331, 333, 338, 339, 341, 345, 354, 355, 357, 361, 369, 388, 390, 391, 394, 395, 397, 402, 403, 405, 409, 418, 419, 421, 425, 433, 450, 451, 453, 457, 465, 481, 520, 524, 526, 527, 532, 534, 535, 538, 539, 541, 548, 550, 551, 554, 555, 557, 562, 563, 565, 569, 580, 582, 583, 586, 587, 589, 594, 595, 597, 601, 610, 611, 613, 617, 625, 644, 646, 647, 650, 651, 653, 658, 659, 661, 665, 674, 675, 677, 681, 689, 706, 707, 709, 713, 721, 737, 772, 774, 775, 778, 779, 781, 786, 787, 789, 793, 802, 803, 805, 809, 817, 834, 835, 837, 841, 849, 865, 898, 899, 901, 905, 913, 929, 961 |
| 7 | $21 \leq K' < 56$ | 8, 12, 14, 15, 20, 22, 23, 26, 27, 29, 36, 38, 39, 42, 43, 45, 50, 51, 53, 57, 68, 70, 71, 74, 75, 77, 82, 83, 85, 89, 98, 99, 101, 105, 113, 132, 134, 135, 138, 139, 141, 146, 147, 149, 153, 162, 163, 165, 169, 177, 194, 195, 197, 201, 209, 225, 260, 262, 263, 266, 267, 269, 274, 275, 277, 281, 290, 291, 293, 297, 305, 322, 323, 325, 329, 337, 353, 386, 387, 389, 393, 401, 417, 449, 516, 518, 519, 522, 523, 525, 530, 531, 533, 537, 546, 547, 549, 553, 561, 578, 579, 581, 585, 593, 609, 642, 643, 645, 649, 657, 673, 705, 770, 771, 773, 777, 785, 801, 833, 897 |
| 8 | $7 \leq K' < 21$ | 4, 6, 7, 10, 11, 13, 18, 19, 21, 25, 34, 35, 37, 41, 49, 66, 67, 69, 73, 81, 97, 130, 131, 133, 137, 145, 161, 193, 258, 259, 261, 265, 273, 289, 321, 385, 514, 515, 517, 521, 529, 545, 577, 641, 769 |
| 9 | $2 \leq K' < 7$ | 2, 3, 5, 9, 17, 33, 65, 129, 257, 513 |

Note: A subchannel number of a selected second-type auxiliary bit is $N-X_j$, where $j=1, 2, \ldots$ or $J'$.

TABLE 12

Correspondence, in the case of $N_{max} = 1024$, between an index and possible second-type auxiliary bit position numbers ranked in descending order of reliability $N_{max} = 1024$

| Index number | Value range of K' | Possible second-type auxiliary bit subchannel position numbers $Q_j$ |
|---|---|---|
| 1 | $984 \leq K' < 1024$ | 512, 768, 896, 960, 992, 1008, 1016, 1020, 1022, 1023 |
| 2 | $805 \leq K' < 984$ | 256, 384, 448, 640, 480, 704, 496, 504, 736, 832, 508, 752, 510, 511, 864, 760, 764, 880, 928, 766, 888, 767, 944, 892, 894, 952, 976, 895, 956, 984, 958, 959, 988, 1000, 990, 1004, 991, 1006, 1012, 1007, 1014, 1015, 1018, 1019, 1021 |
| 3 | $531 \leq K' < 805$ | 128, 192, 224, 320, 240, 352, 248, 576, 252, 368, 416, 254, 376, 255, 608, 432, 380, 624, 382, 440, 672, 464, 383, 632, 444, 688, 472, 636, 446, 447, 800, 638, 476, 696, 488, 720, |

TABLE 12-continued

Correspondence, in the case of $N_{max} = 1024$, between an index and possible second-type auxiliary bit position numbers ranked in descending order of reliability $N_{max} = 1024$

| Index number | Value range of K' | Possible second-type auxiliary bit subchannel position numbers $Q_j$ |
|---|---|---|
| | | 639, 478, 700, 816, 492, 479, 728, 702, 494, 824, 500, 703, 732, 495, 848, 744, 502, 828, 734, 503, 856, 748, 830, 735, 506, 912, 831, 750, 507, 860, 756, 872, 751, 509, 862, 920, 758, 876, 863, 759, 924, 762, 878, 936, 884, 763, 926, 879, 940, 886, 927, 765, 968, 887, 942, 890, 948, 943, 972, 891, 950, 974, 893, 951, 980, 954, 975, 982, 955, 996, 983, 957, 986, 998, 987, 999, 1002, 989, 1003, 1010, 1005, 1011, 1013, 1017 |
| 4 | $287 \leq K' < 531$ | 64, 96, 112, 160, 120, 176, 124, 288, 126, 184, 208, 127, 188, 304, 216, 190, 312, 191, 544, 220, 336, 232, 316, 222, 560, 344, 236, 318, 223, 400, 319, 238, 348, 568, 244, 360, 239, 592, 350, 408, 246, 572, 364, 351, 247, 600, 574, 412, 250, 366, 424, 372, 656, 575, 251, 604, 414, 367, 616, 428, 374, 415, 253, 606, 664, 456, 375, 620, 430, 607, 378, 436, 668, 431, 784, 622, 460, 379, 680, 628, 438, 670, 623, 462, 381, 439, 792, 684, 630, 468, 671, 442, 463, 712, 631, 686, 470, 443, 796, 634, 692, 808, 484, 687, 471, 716, 635, 445, 798, 474, 694, 486, 812, 799, 718, 637, 475, 695, 724, 487, 698, 840, 814, 719, 490, 477, 820, 726, 699, 815, 491, 844, 740, 822, 727, 498, 701, 730, 493, 846, 904, 823, 742, 499, 852, 826, 731, 847, 743, 501, 908, 854, 827, 746, 733, 868, 855, 747, 910, 829, 505, 858, 916, 754, 870, 911, 749, 859, 755, 918, 871, 874, 861, 932, 919, 757, 922, 875, 934, 882, 923, 761, 877, 935, 964, 883, 938, 925, 966, 939, 885, 946, 967, 941, 970, 889, 947, 971, 949, 978, 973, 979, 953, 994, 981, 995, 985, 997, 1001, 1009 |
| 5 | $134 \leq K' < 287$ | 32, 48, 56, 80, 60, 88, 62, 144, 63, 92, 104, 94, 152, 108, 95, 156, 272, 110, 168, 116, 158, 111, 280, 172, 118, 159, 200, 119, 174, 284, 122, 180, 296, 175, 528, 204, 123, 286, 182, 300, 287, 206, 125, 183, 536, 212, 186, 328, 302, 207, 308, 214, 187, 540, 303, 332, 552, 228, 310, 215, 189, 542, 218, 334, 392, 311, 230, 556, 340, 543, 314, 219, 335, 231, 584, 558, 396, 342, 315, 234, 221, 564, 356, 559, 343, 235, 588, 398, 317, 346, 566, 404, 242, 358, 399, 237, 590, 347, 648, 567, 243, 596, 406, 359, 570, 591, 362, 349, 420, 407, 245, 652, 598, 571, 410, 363, 612, 422, 599, 370, 654, 573, 411, 249, 602, 365, 660, 423, 776, 614, 452, 371, 655, 426, 603, 413, 662, 615, 454, 427, 373, 780, 618, 605, 676, 663, 434, 455, 666, 619, 429, 782, 458, 377, 678, 435, 788, 626, 667, 783, 621, 459, 679, 708, 627, 437, 790, 682, 466, 669, 461, 804, 791, 710, 683, 629, 467, 441, 794, 690, 806, 711, 482, 685, 469, 795, 714, 633, 691, 807, 483, 836, 810, 715, 797, 473, 693, 722, 485, 838, 811, 717, 818, 723, 697, 839, 813, 489, 842, 900, 819, 738, 725, 843, 739, 902, 821, 497, 850, 729, 845, 903, 741, 851, 906, 825, 866, 907, 853, 745, 914, 867, 909, 857, 915, 753, 869, 930, 917, 873, 931, 921, 933, 962, 881, 963, 937, 965, 945, 969, 977, 993 |
| 6 | $56 \leq K' < 134$ | 16, 24, 28, 40, 30, 44, 31, 72, 46, 52, 47, 76, 54, 78, 136, 55, 84, 58, 79, 140, 86, 59, 100, 87, 142, 61, 90, 148, 264, 102, 143, 91, 150, 103, 268, 106, 93, 164, 151, 154, 107, 270, 166, 276, 114, 155, 271, 109, 167, 520, 196, 115, 278, 170, 157, 292, 279, 198, 171, 117, 524, 282, 178, 294, 199, 173, 526, 283, 202, 121, 179, 532, 295, 324, 527, 298, 203, 285, 181, 534, 210, 326, 299, 205, 548, 535, 306, 211, 185, 327, 538, 301, 330, 550, 388, 307, 226, 213, 539, 331, 551, 227, 580, 390, 309, 554, 338, 541, 217, 333, 391, 229, 582, 555, 339, 394, 313, 562, 583, 354, 557, 395, 341, 233, 586, 644, 563, 402, 355, 587, 397, 345, 646, 565, 403, 241, 594, 357, 589, 647, 418, 595, 405, 650, 569, 361, 419, 772, 610, 651, 597, 409, 658, 611, 421, 774, 450, 369, 653, 601, 659, 775, 613, 451, 425, 778, 674, 661, 453, 779, 617, 675, 433, 786, 665, 781, 457, 677, 787, 706, 625, 802, 707, 789, 681, 465, 803, 709, 793, 689, 805, 481, 834, 713, 835, 809, 721, 837, 898, 817, 841, 899, 737, 901, 849, 905, 865, 913, 929, 961 |
| 7 | $21 \leq K' < 56$ | 8, 12, 14, 20, 15, 22, 36, 23, 26, 38, 27, 39, 68, 42, 29, 70, 43, 50, 71, 45, 74, 132, 51, 75, 134, 53, 82, 77, 135, 83, 138, 57, 260, 98, 139, 85, 146, 99, 262, 141, 89, 147, 263, 101, 266, 162, 149, 267, 105, 163, 516, 274, 153, 269, 165, 518, 275, 194, 113, 519, 290, 195, 277, 169, 522, 291, 197, 523, 281, 177, 530, 293, 322, 525, 201, 531, 323, 297, 546, 533, 209, 325, 547, 386, 305, 537, 329, 549, 387, 225, 578, 579, 389, 553, 337, 581, 393, 642, 561, 353, 585, 643, 401, 645, |

TABLE 12-continued

Correspondence, in the case of $N_{max} = 1024$, between an index and possible second-type auxiliary bit position numbers ranked in descending order of reliability $N_{max} = 1024$

| Index number | Value range of K' | Possible second-type auxiliary bit subchannel position numbers $Q_j$ |
|---|---|---|
|  |  | 593, 417, 770, 649, 771, 609, 657, 773, 449, 777, 673, 785, 705, 801, 833, 897 |
| 8 | 7 ≤ K' < 21 | 4, 6, 7, 10, 11, 18, 13, 19, 34, 21, 35, 25, 37, 66, 67, 41, 69, 130, 49, 73, 131, 133, 81, 258, 137, 259, 97, 145, 261, 265, 161, 514, 515, 273, 517, 193, 289, 521, 529, 321, 545, 385, 577, 641, 769 |
| 9 | 2 ≤ K' < 7 | 2, 3, 5, 9, 17, 33, 65, 129, 257, 513 |

Note: A subchannel number of a selected second-type auxiliary bit is $N-X_j$, where j=1, 2, . . . or J'.

What is claimed is:

1. A method for a communication device to send information in a wireless communication network, comprising:
obtaining K bits of information, wherein K≥1, and wherein the K bits of information are a part of an N-bit sequence $u_1^N$, N is an integer power of 2;
determining N−M subchannels corresponding to N−M to-be-removed bits;
determining K' subchannels corresponding to the K information bits, a quantity J of first-type auxiliary bits, and a quantity J' of second-type auxiliary bits according to reliabilities of the subchannels, wherein N≥K', and K'=K+J+J';
generating the sequence $u_1^N$, wherein the sequence $u_1^N$ comprises N bits, each bit of the sequence $u_1^N$ corresponds to a subchannel, the K information bits, the J first-type auxiliary bits, and the J' second-type auxiliary bits are placed in K' positions of the sequence $u_1^N$ according to the determined K' subchannels;
encoding the sequence $u_1^N$ in an encoding process, to obtain an N-bit encoded sequence;
removing N−M bits from the encoded sequence according to the determined N−M subchannels, to obtain an M-bit output sequence; and
outputting the output sequence.

2. The method according to claim 1, wherein the first-type auxiliary bits are cyclic redundancy check (CRC) bits.

3. The method according to claim 1, wherein the second-type auxiliary bits are parity check bits.

4. The method according to claim 3, wherein J'=3.

5. The method according to claim 4, wherein when N=64 and 19≤K'<38, the three parity check bits are placed in three of the following bit positions of the sequence $u_1^N$:
{56, 52, 50, 49, 44, 42, 41, 38, 37, 35, 28, 26, 25, 22, 21, 19, 14, 13, 11, 7}.

6. The method according to claim 5, wherein the three parity check bits are placed in the following bit positions of the sequence $u_1^N$:
{11, 13, 19}; or
{21, 25, 35}; or
{25, 35, 37}.

7. The method according to claim 1, wherein encoding the sequence $u_1^N$ in an encoding process, to obtain an N-bit encoded sequence comprises:
encoding the sequence $u_1^N$ in a polar coding process $x_1^N = u_1^N G_N$, to obtain the encoded sequence $x_1^N$, wherein $G_N$ is a polar code generator matrix of N rows×N columns.

8. An apparatus, comprising a processor and a memory; wherein the memory is configured to store computer-executable instructions, and the processor is configured to execute the instructions to perform the tasks of:
obtaining K bits of information, wherein K≥1, and wherein the K bits of information are a part of an N-bit sequence $u_1^N$, N is an integer power of 2;
determining N−M subchannels corresponding to N−M to-be-removed bits;
determining K' subchannels corresponding to the K information bits, a quantity J of first-type auxiliary bits, and a quantity J' of second-type auxiliary bits according to reliabilities of the subchannels, wherein N≥K', and K'=K+J+J';
generating the sequence $u_1^N$, wherein the sequence $u_1^N$ comprises N bits, each bit of the sequence $u_1^N$ corresponds to a subchannel, the K information bits, the J first-type auxiliary bits, and the J' second-type auxiliary bits are placed in K' positions of the sequence $u_1^N$ according to the determined K' subchannels;
encoding the sequence $u_1^N$ in an encoding process, to obtain an N-bit encoded sequence;
removing N−M bits from the encoded sequence according to the determined N−M subchannels, to obtain an M-bit output sequence; and
outputting the output sequence.

9. The apparatus according to claim 8, wherein the first-type auxiliary bits are cyclic redundancy check (CRC) bits.

10. The apparatus according to claim 8, wherein the second-type auxiliary bits are parity check bits.

11. The apparatus according to claim 10, wherein J'=3.

12. The apparatus according to claim 11, wherein when N=64 and 19≤K'<38, the three parity check bits are placed in three of the following bit positions of the sequence $u_1^N$:
{56, 52, 50, 49, 44, 42, 41, 38, 37, 35, 28, 26, 25, 22, 21, 19, 14, 13, 11, 7}.

13. The apparatus according to claim 12, wherein the three parity check bits are placed in the following bit positions of the sequence $u_1^N$:
{11, 13, 19}; or
{21, 25, 35}; or
{25, 35, 37}.

14. The apparatus according to claim 8, wherein in encoding the sequence $u_1^N$, the processor is configured to perform:
encoding the sequence $u_1^N$ in a polar coding process $x_1^N = u_1^N G_N$, to obtain the encoded sequence $x_1^N$, wherein $G_N$ is a polar code generator matrix of N rows×N columns.

15. A non-transitory storage medium storing computer-executable instructions which, when executed by a processor of a communication device, cause the communication device to:

obtain K bits of information, wherein K≥1, and wherein the K bits of information are a part of an N-bit sequence $u_1^N$, N is an integer power of 2;

determine N−M subchannels corresponding to N−M to-be-removed bits;

determine K' subchannels corresponding to the K information bits, a quantity J of first-type auxiliary bits, and a quantity J' of second-type auxiliary bits according to reliabilities of the subchannels, wherein N≥K', and K'=K+J+J';

generate the sequence $u_1^N$, wherein the sequence $u_1^N$ comprises N bits, each bit of the sequence $u_1^N$ corresponds to a subchannel, the K information bits, the J first-type auxiliary bits, and the J' second-type auxiliary bits are placed in K' positions of the sequence $u_1^N$ according to the determined K' subchannels;

encode the sequence $u_1^N$ in an encoding process to obtain an N-bit encoded sequence;

remove N−M bits from the encoded sequence according to the determined N−M subchannels, to obtain an M-bit output sequence; and output the output sequence.

16. The non-transitory storage medium according to claim 15, wherein the second-type auxiliary bits are parity check bits.

17. The non-transitory storage medium according to claim 16, wherein J'=3.

18. The non-transitory storage medium according to claim 17, wherein when N=64 and 19≤K'<38, the three parity check bits are placed in three of the following bit positions of the sequence $u_1^N$:

{56, 52, 50, 49, 44, 42, 41, 38, 37, 35, 28, 26, 25, 22, 21, 19, 14, 13, 11, 7}.

19. The non-transitory storage medium according to claim 18, wherein the three parity check bits are placed in the following bit positions of the sequence $u_1^N$:

{11, 13, 19}; or

{21, 25, 35}; or

{25, 35, 37}.

20. The non-transitory storage medium according to claim 15, wherein in encoding the sequence $u_1^N$, the communication device is caused to:

encode the sequence $u_1^N$ in a polar coding process $x_1^N = u_1^N G_N$, to obtain the encoded sequence $x_1^N$, wherein $G_N$ is a polar code generator matrix of N rows×N columns.

* * * * *